US011013105B2

(12) United States Patent
Ye et al.

(10) Patent No.: US 11,013,105 B2
(45) Date of Patent: May 18, 2021

(54) IMAGE PICKUP UNIT AND IMAGE PICKUP APPARATUS

(71) Applicant: CANON KABUSHIKI KAISHA, Tokyo (JP)

(72) Inventors: Wenying Ye, Kawasaki (JP); Yasuhiko Sano, Sagamihara (JP); Shinichi Nishimura, Yokohama (JP); Takafumi Kishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/560,154

(22) Filed: Sep. 4, 2019

(65) Prior Publication Data
US 2020/0084877 A1   Mar. 12, 2020

(30) Foreign Application Priority Data

Sep. 12, 2018 (JP) .............................. JP2018-170611
Aug. 2, 2019 (JP) .............................. JP2019-142807

(51) Int. Cl.
| | | |
|---|---|---|
| *H05K 1/02* | (2006.01) | |
| *H04N 5/225* | (2006.01) | |
| *H04N 5/357* | (2011.01) | |
| *H04N 5/369* | (2011.01) | |
| *H01L 27/146* | (2006.01) | |

(52) U.S. Cl.
CPC ......... *H05K 1/0215* (2013.01); *H04N 5/2252* (2013.01); *H04N 5/2253* (2013.01)

(58) Field of Classification Search
CPC .......................... H05K 1/0215; H04N 5/2252
See application file for complete search history.

(56) References Cited

U.S. PATENT DOCUMENTS

| | | | | |
|---|---|---|---|---|
| 5,561,584 A | * | 10/1996 | Tang | ..................... H05K 1/0216 361/220 |
| 6,091,448 A | * | 7/2000 | Washisu | ............. H04N 5/23248 348/208.16 |
| 7,589,787 B2 | | 9/2009 | Shinomiya | |
| 7,692,300 B2 | | 4/2010 | Kikuchi | |
| 8,174,118 B2 | | 5/2012 | Nagai et al. | |
| 8,482,107 B2 | | 7/2013 | Rokuhara et al. | |
| 9,666,626 B2 | | 5/2017 | Kishi | |

(Continued)

FOREIGN PATENT DOCUMENTS

| | | |
|---|---|---|
| CN | 1577878 A | 2/2005 |
| CN | 101090605 A | 12/2007 |

(Continued)

OTHER PUBLICATIONS

Office Action dated Mar. 17, 2021, in Chinese Patent Application No. 201910845869.9.

*Primary Examiner* — Christopher K Peterson
(74) *Attorney, Agent, or Firm* — Venable LLP

(57) ABSTRACT

An image pickup unit includes an image pickup element and a wiring board. The image pickup element includes an analog circuit. The analog circuit includes an analog ground wiring. The image pickup element is mounted on the wiring board. The wiring board includes a first ground wiring that is connected to the analog ground wiring and forms a closed loop with the analog ground wiring in a side view of the image pickup unit, and a second ground wiring that is connected to the first ground wiring via only a first via conductor.

26 Claims, 21 Drawing Sheets

(56) References Cited

U.S. PATENT DOCUMENTS

| | | | |
|---|---|---|---|
| 10,015,430 B2 | 7/2018 | Kobayashi et al. | |
| 2015/0350577 A1* | 12/2015 | Nishimura | H04N 5/2252 |
| | | | 348/208.1 |
| 2017/0078603 A1 | 3/2017 | Yamasaki et al. | |
| 2017/0155862 A1* | 6/2017 | Kobayashi | H04N 5/378 |
| 2017/0230592 A1 | 8/2017 | Goto et al. | |

FOREIGN PATENT DOCUMENTS

| | | |
|---|---|---|
| CN | 102164258 A | 8/2011 |
| CN | 102194817 A | 9/2011 |
| CN | 106817546 A | 6/2017 |
| JP | 5417850 B2 | 2/2014 |
| JP | 2017-055099 A | 3/2017 |
| JP | 2017-103517 A | 6/2017 |

* cited by examiner

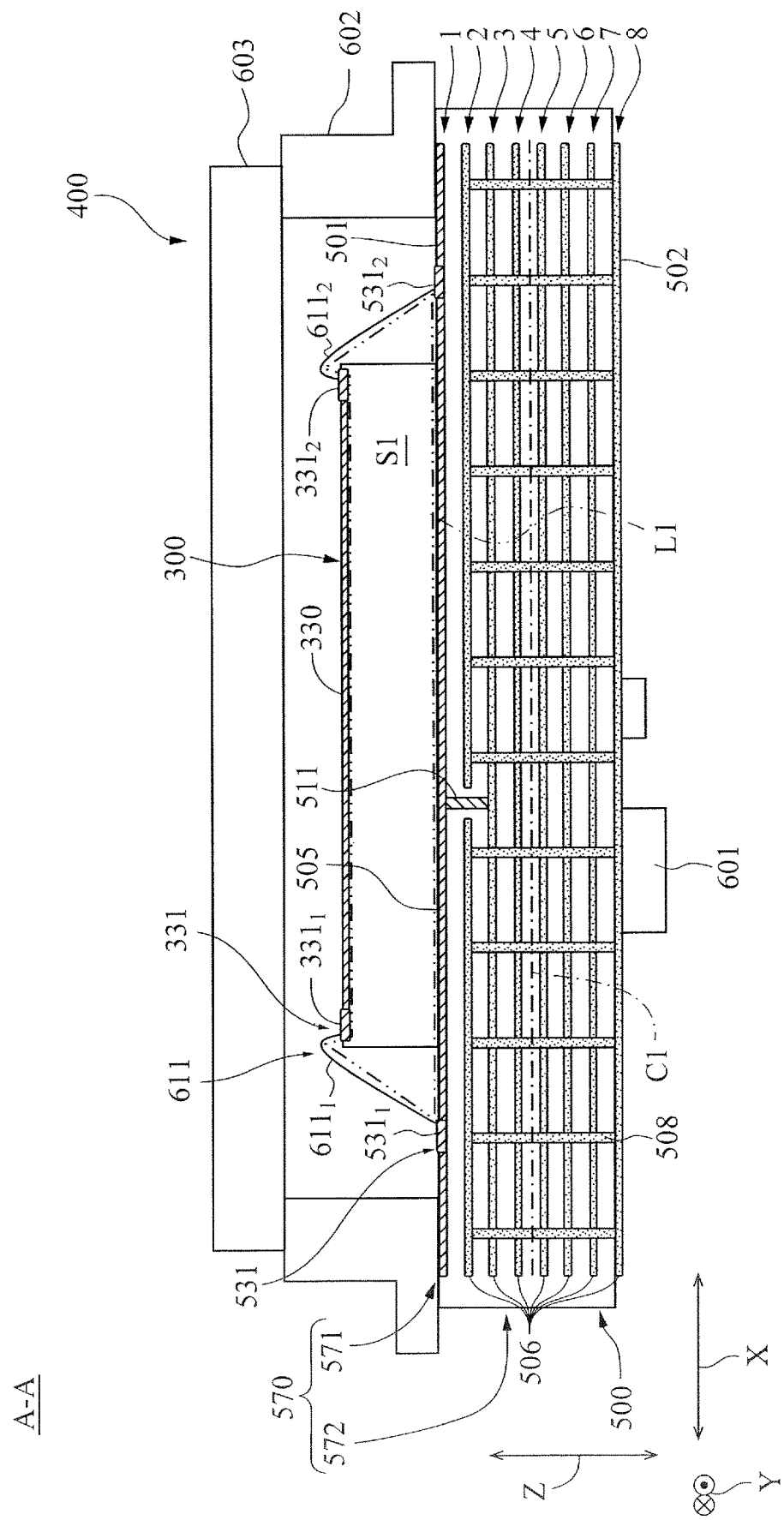

IMAGE PICKUP UNIT AND IMAGE PICKUP APPARATUS

BACKGROUND OF THE INVENTION

Field of the Invention

The present invention relates to an image pickup unit including an image pickup element.

Description of the Related Art

An image pickup apparatus such as a digital camcorder or a digital still camera includes an image pickup unit including an image pickup element. In recent years, the ISO sensitivity of image pickup element has increased, and clearer images are generated even in the case where images are captured in a scene with a small light quantity such as a night scene. However, accompanied by the increase in the ISO sensitivity, sensitivity to a small noise that has not been conventionally a problem has also increased. As a result, a problem that the image pickup element is affected by the noise and the image is disturbed has emerged.

Japanese Patent Laid-Open No. 2017-103517 discloses an image pickup unit in which a magnetic field noise that reaches an image pickup chip is reduced as a result of magnetic field noises radiated respectively from a power source pattern and a ground pattern of a board on which the image pickup chip is mounted by an operation of a processing circuit of the image pickup chip cancelling each other.

However, the magnetic field noise that reaches the image pickup element is not necessarily caused by the operation of the image pickup element itself. For example, there is a digital single lens reflex camera or the like including a lens barrel which is attachable to and detachable from a camera body and includes therein a coil for driving a lens. There is also a camera including a coil for driving a sensor in the camera body. A magnetic field noise is also generated in an inductor element like these coils. In addition, a magnetic field noise reaches the image pickup element from the outside in some cases.

As described above, the image pickup element is exposed to a magnetic field noise for various reasons, and it is difficult to prevent a magnetic field noise from reaching an image pickup unit including an image pickup element.

SUMMARY OF THE INVENTION

According to a first aspect of the present invention, an image pickup unit includes an image pickup element and a wiring board. The image pickup element includes an analog circuit. The analog circuit includes an analog ground wiring. The image pickup element is mounted on the wiring board. The wiring board includes a first ground wiring that is connected to the analog ground wiring and forms a closed loop with the analog ground wiring in a side view of the image pickup unit, and a second ground wiring that is connected to the first ground wiring via only a first via conductor.

According to a second aspect of the present invention, an image pickup unit includes an image pickup element and a wiring board. The image pickup element includes an analog circuit. The analog circuit includes an analog ground wiring. The image pickup element is mounted on the wiring board. The wiring board includes a first ground wiring that is connected to the analog ground wiring and forms a closed loop with the analog ground wiring in a side view of the image pickup unit, and a second ground wiring that is connected to the first ground wiring via only a plurality of first via conductors. X1 represents a length of a first side of the image pickup element in a plan view, Y1 represents a length of a second side of the image pickup element intersecting with the first side in the plan view, and D1 represents a distance between two most separated first via conductors among the plurality of first via conductors in the plan view. The following formula is satisfied.

$$D1 \leq \frac{\sqrt{X1^2 + Y1^2}}{10}$$

Further features of the present invention will become apparent from the following description of exemplary embodiments with reference to the attached drawings.

BRIEF DESCRIPTION OF THE DRAWINGS

FIG. 5 is a section view of the image pickup unit according to the first exemplary embodiment.

DESCRIPTION OF THE EMBODIMENTS

Exemplary embodiments of the present invention will be described below in detail with reference to drawings.

First Exemplary Embodiment

Figure 1:
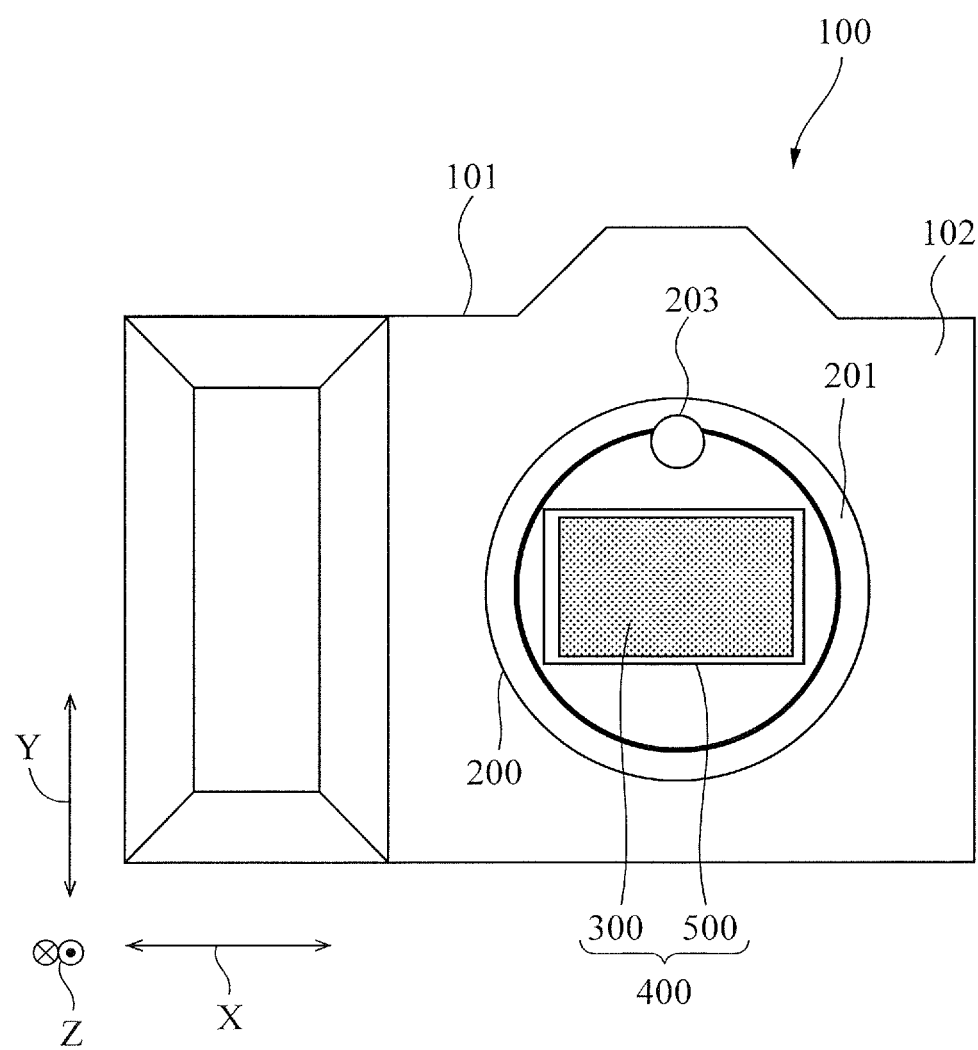
FIG. 1 is a schematic view of a camera serving as an example of an image pickup apparatus according to a first exemplary embodiment.
Figure 2:
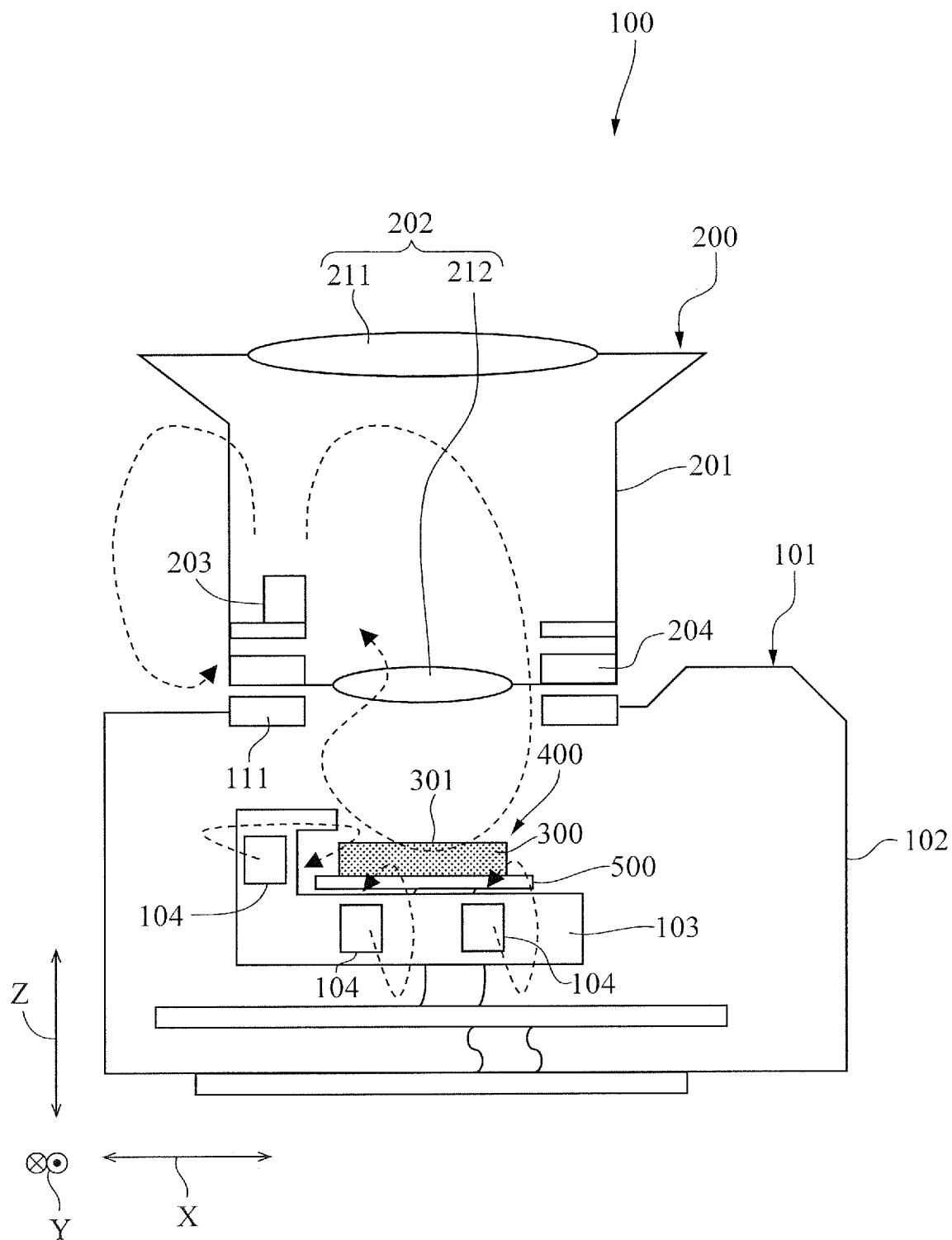
FIG. 2 is a schematic view of the camera serving as an example of an image pickup apparatus according to the first exemplary embodiment.

FIGS. 1 and 2 are schematic views of a camera 100 serving as an example of an image pickup apparatus according to a first exemplary embodiment. FIG. 1 is a diagram schematically illustrating the front side of the camera 100, and FIG. 2 is a diagram schematically illustrating a section of the camera 100. The camera 100 is a digital camera such as a digital still camera or a digital camcorder. Although the camera 100 may be a camera in which a lens and a camera body are integrated, in the first exemplary embodiment, the camera 100 is a digital single reflex lens camera and includes a camera body 101 and a lens barrel 200 attachable to and detachable from the camera body 101.

The camera body 101 includes an exterior case 102 serving as a casing. The exterior case 102 includes a mount 111 to and from which the lens barrel 200 is attachable and detachable. An image pickup unit 400 including an image pickup element 300 and a wiring board 500 is disposed inside the exterior case 102. The image pickup element 300 includes a light receiving surface 301, and the image pickup element 300 is mounted on the wiring board 500. A direction perpendicular to the light receiving surface 301 will be referred to as a Z direction.

The image pickup unit 400 is held by a metal frame 103. A plurality of coils 104 that serve as examples of an inductor element and mechanically drive the image pickup unit 400 are disposed in the metal frame 103. Each coil 104 generates Lorentz force and drives the image pickup unit 400 in a direction opposite to a direction of camera shake. The image pickup element 300 is an image pickup chip such as a complementary metal oxide semiconductor: CMOS image sensor or a charge coupled device: CCD image sensor, and has a quadrilateral, specifically a rectangular external shape as viewed in the Z direction perpendicular to the light receiving surface 301 of the image pickup element 300. A direction of a long side of the image pickup element 300 parallel to the light receiving surface 301 of the image pickup element 300 will be referred to as an X direction, and a direction of a short side of the image pickup element 300 parallel to the light receiving surface 301 will be referred to as a Y direction. In the first exemplary embodiment, the Y direction serves as a first direction, and the Z direction serves as a second direction. The image pickup element 300 photoelectrically converts an optical image formed on the light receiving surface 301 into a pixel signal, and outputs the pixel signal to the wiring board 500.

The lens barrel 200 includes a lens case 201 and an optical system 202 that is supported by the lens case 201 and forms an optical image on the light receiving surface 301 of the image pickup element 300 when the lens barrel 200 is attached to the exterior case 102. In addition, the lens barrel 200 includes a coil 203 that is disposed inside the lens case 201, serves as an example of an inductor element, and mechanically drives the optical system 202. The optical system 202 includes a lens 211 disposed on the light incidence side of the lens case 201 and a lens 212 disposed on the light emitting side of the lens 212. The lens case 201 includes a ring mount 204. The lens 212 is supported by the ring mount 204. The coil 203 is disposed at a position that does not block an optical path from the optical system 202 to the light receiving surface 301 of the image pickup element 300, that is, on an outer periphery of the image pickup element 300 in front view as illustrated in FIG. 1.

The coils 104 and 203 are operated by being supplied with an alternate current having a frequency of a kHz band, that is, a frequency of 1 kHz or higher and lower than 1 MHz. As a result of the alternate current being supplied to the coils 104 and 203, magnetic fluxes are generated therearound. These magnetic fluxes become the magnetic field noise on the image pickup element 300. To be noted, the directions of the magnetic fluxes are indicated by broken arrows in FIG. 2. Since the magnetic fluxes are alternate magnetic fields generated by an alternate current, the directions are switched between the directions of the broken arrows and directions opposite thereto.

Figure 3:
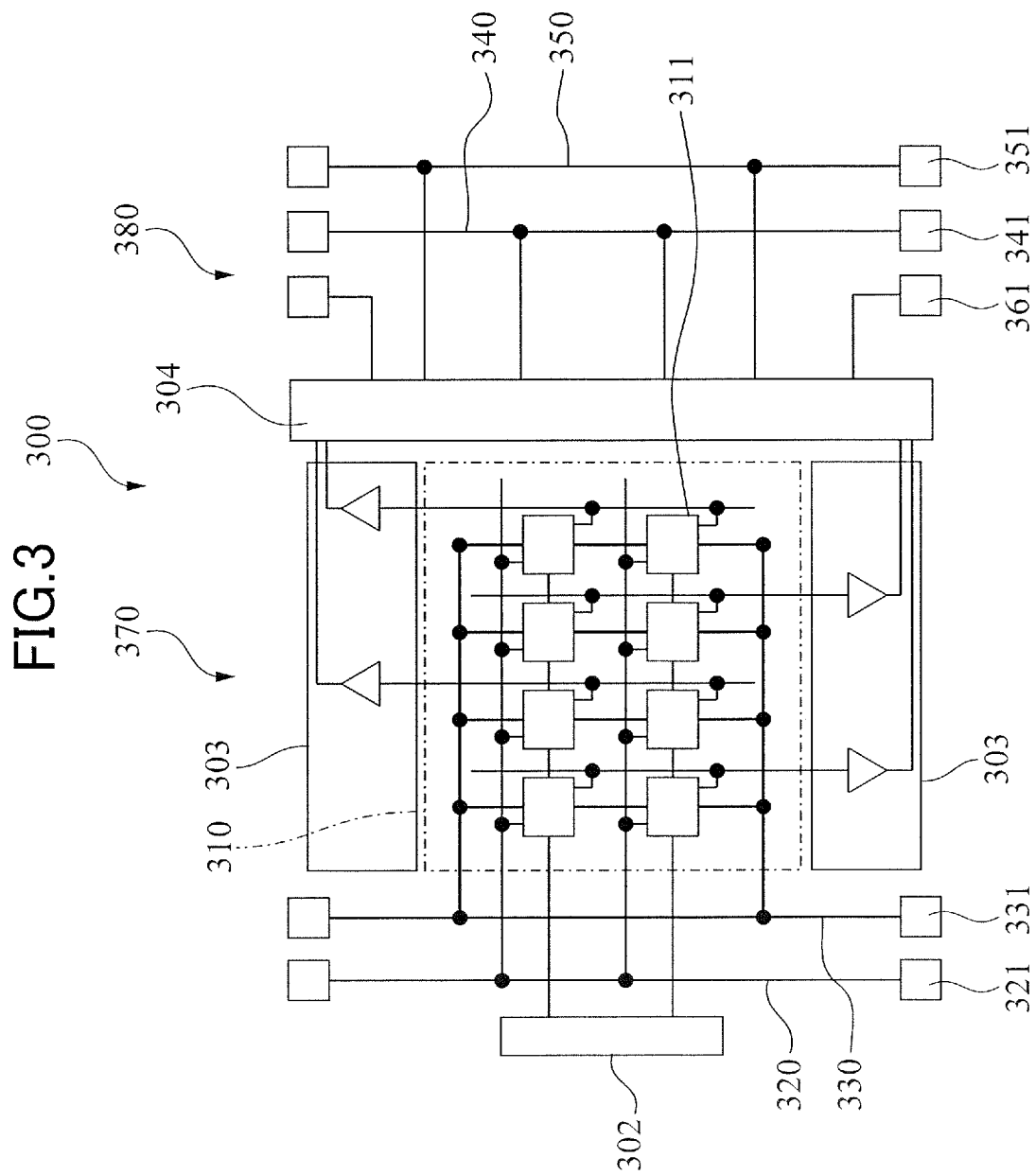
FIG. 3 is a circuit diagram illustrating an example of a configuration of an image pickup element according to the first exemplary embodiment.

FIG. 3 is a circuit diagram illustrating an example of a configuration of the image pickup element 300 according to the first exemplary embodiment. The image pickup element 300 illustrated in FIG. 3 includes an analog circuit 370 and a digital circuit 380. The analog circuit 370 includes a pixel array 310, a vertical scanning circuit 302, and a peripheral circuit 303. The digital circuit 380 includes a signal processing circuit 304. Although a case where the pixel array 310, the vertical scanning circuit 302, the peripheral circuit 303, and the signal processing circuit 304 are disposed in the same plane will be described as an example, the configuration is not limited to this. A layered structure in which the pixel array 310, the vertical scanning circuit 302, the peripheral circuit 303, and the signal processing circuit 304 are each disposed in a different plane separate in the Z direction may be employed.

The analog circuit 370 includes an analog power source wiring 320 and an analog ground wiring 330. The digital circuit 380 includes a digital power source wiring 340 and a digital ground wiring 350. In the image pickup element 300, the analog power source wiring 320 and the digital power source wiring 340 are separated from each other, and the analog ground wiring 330 and the digital ground wiring 350 are separated from each other. Although the illustration is omitted, as viewed in a direction perpendicular to the light receiving surface 301 of the image pickup element 300, the analog power source wiring 320 and the analog ground wiring 330 overlap with each other, and the digital power source wiring 340 and the digital ground wiring 350 overlap with each other. The analog power source wiring 320 is connected to a plurality of analog power source electrodes 321. The analog ground wiring 330 is connected to a plurality of analog ground electrodes 331. The digital power source wiring 340 is connected to a plurality of digital power source electrodes 341. The digital ground wiring 350 is connected to a plurality of digital ground electrodes 351. To be noted, in FIG. 3, only one of each of the analog power source electrodes 321, the analog ground electrodes 331, the digital power source electrodes 341, and the digital ground electrodes 351 is illustrated.

The pixel array 310 includes a plurality of pixels 311 arranged in a two-dimensional matrix shape, that is, arranged in a row direction and in a column direction. The row direction is a lateral direction, that is, the horizontal direction in FIG. 3. The column direction is a longitudinal direction, that is, the vertical direction in FIG. 3. Each of the pixels 311 outputs a pixel signal corresponding to the amount of received light as an analog signal. Each of the pixels 311 includes a photoelectric conversion portion and an amplification portion that outputs a signal based on an electric charge generated in the photoelectric conversion portion. Although the pixel array 310 of 2 rows×4 columns is illustrated in FIG. 3 for the sake of simplicity of the drawing, the number of rows and the number of columns of the pixel array 310 are not limited to these.

The vertical scanning circuit 302 performs driving control such as a reset operation, an accumulating operation, and a signal reading operation of the pixels 311 row by row. The peripheral circuit 303 includes a differential amplifier circuit that removes a noise such as a random noise, and outputs a pixel signal from which a noise has been removed as an analog signal. The signal processing circuit 304 processes and converts the pixel signal into a digital signal under control of the vertical scanning circuit 302 and the peripheral circuit 303, and outputs the digital signal to the wiring board 500 of FIG. 2 via a signal electrode 361.

Figure 4:
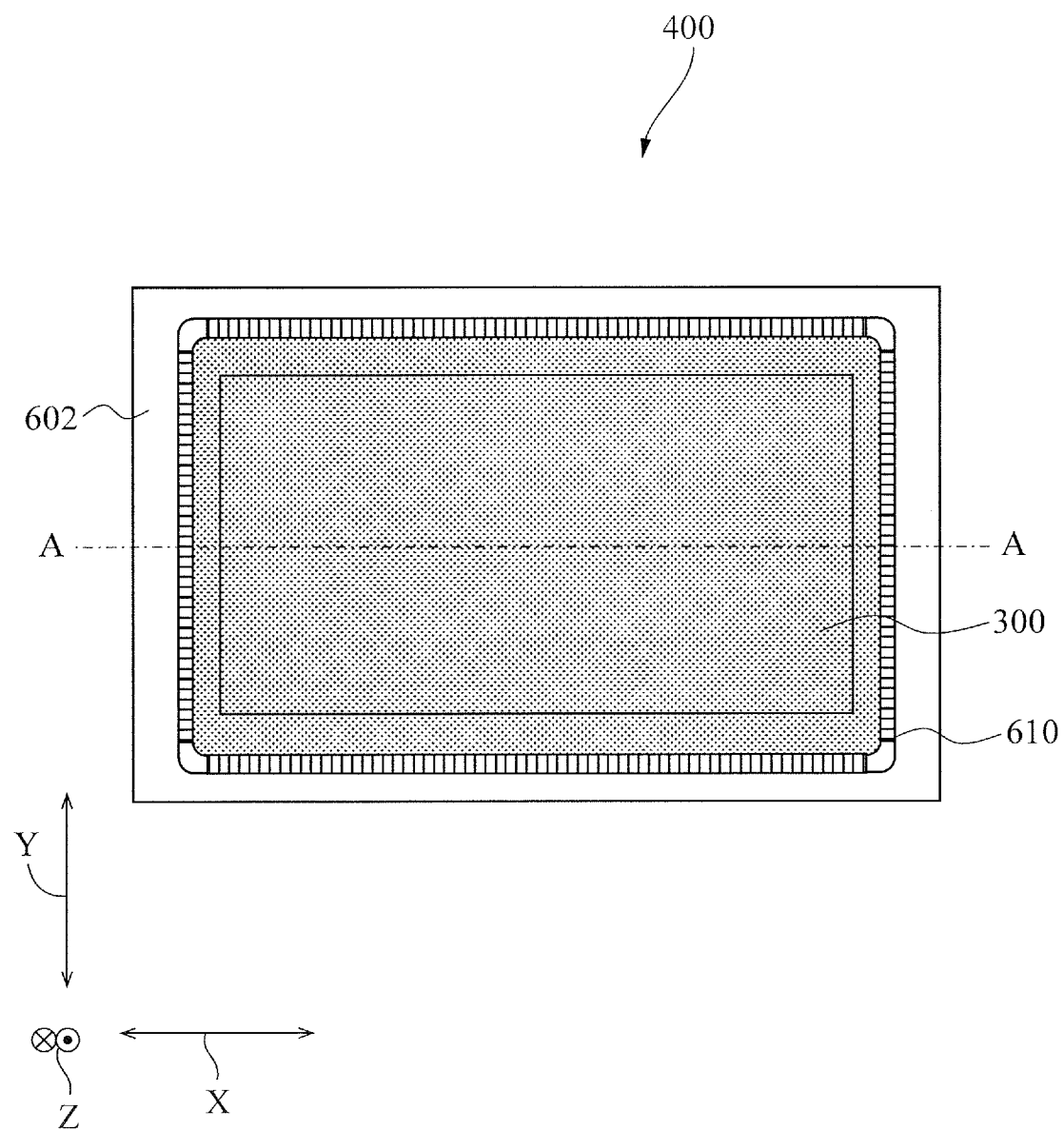
FIG. 4 is a schematic plan view of an image pickup unit according to the first exemplary embodiment.

FIG. 4 is a schematic plan view of the image pickup unit 400 according to the first exemplary embodiment. FIG. 5 is a section view of the image pickup unit 400 taken along a line A-A of FIG. 4. FIG. 5 is a schematic diagram of the section of the image pickup unit 400 in a side view. Further, FIG. 5 schematically illustrates a ground wiring. The image pickup unit 400 includes the image pickup element 300, the wiring board 500, a frame 602, and a cover glass 603. The wiring board 500 is a printed wiring board in the first exemplary embodiment. The wiring board 500 includes a conductor portion and an insulator portion. The conductor portion is formed from a conductive metal material, for example, copper or gold. The insulator portion is formed from an electrically insulating material, for example, an epoxy resin.

The wiring board 500 is a layered board including a plurality of, for example, eight conductor layers 1 to 8 arranged with intervals therebetween in the Z direction, which is the thickness direction of the wiring board 500. An insulator layer is disposed between each two adjacent conductor layers among the conductor layers 1 to 8. A conductor pattern is disposed in each of the conductor layers 1 to 8. The wiring board 500 includes two main surfaces 501 and 502. The image pickup element 300 is mounted on the main surface 501 on the conductor layer 1 side of the wiring board 500.

The plurality of conductor layers 1 to 8 are disposed in a layered manner in the order of the conductor layer 1, the conductor layer 2, the conductor layer 3, the conductor layer 4, the conductor layer 5, the conductor layer 6, the conductor layer 7, and the conductor layer 8 from the image pickup element 300 side. The conductor layers 1 and 8 are surface layers, that is, outer layers, and the conductor layers 2 to 7 are inner layers. A circuit component 601 such as a capacitor is mounted on the main surface 502 on the conductor layer 8 side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1 and 8.

The image pickup element 300 is disposed on the main surface 501 and connected to the wiring board 500 via wire bonding. That is, the wiring of the image pickup element 300 and the wiring of the wiring board 500 are electrically connected to each other via a plurality of wires 610 that are a plurality of metal members illustrated in FIG. 4. To be noted, although the image pickup element 300 is mounted on the wiring board 500 via wire bonding, the configuration is not limited to this, and the image pickup element 300 may be mounted on the wiring board 500 via flip chip bonding. In this case, the image pickup element and the wiring board are connected to each other via a plurality of metal members such as a plurality of solder balls.

The magnetic field noise generated in inductor elements such as the coils 104 and 203 of FIG. 2 reaches the image pickup unit 400. When the magnetic flux density is B, the area of a closed loop formed by the wiring is S, and the magnetic flux that intersects with the closed loop, that is, the magnetic noise is $\Phi$, $\Phi=B\times S$ is satisfied. That is, the magnetic flux $\Phi$ is proportional to the area S of the closed loop. When the magnetic flux $\Phi$ intersects with the closed loop, an induced electromotive force V is generated in the closed loop of wiring. This follows the Faraday and Lenz's law. The relationship between the induced electromotive force V and a change $\Delta\Phi$ of the magnetic flux $\Phi$ in infinitesimal time $\Delta t$ is represented by $V=-\Delta\Phi/\Delta t$. Since $\Delta\Phi$ is proportional to the area S of the closed loop, the induced electromotive force V generated in the closed loop is also proportional to the area S of the closed loop. The relationship between the induced electromotive force V generated in the closed loop, the impedance R of the closed loop, and an induced current I that flows in the closed loop is represented by I=V/R in accordance with the Ohm's law. Since the induced current I is inversely proportional to the impedance R, the induced current I is larger when the impedance R is smaller. In the case where the direction of the magnetic flux $\Phi$ is changed by 180°, the directions of the induced electromotive force V and the current I are also changed by 180°. In addition, also in the case where the magnetic flux $\Phi$ reaches the closed loop obliquely with respect to the closed loop plane, the induced electromotive force V is generated in accordance with a component of the magnetic flux $\Phi$ in a direction perpendicular to the closed loop plane.

Closed loops in the image pickup unit 400 have different resistances with respect to the magnetic field noise depending on the types of circuits to which the closed loops are connected. Specifically, in the image pickup unit 400, the closed loop of the ground of the analog circuit has lower resistance to the magnetic field noise than the closed loop of the ground of the digital circuit. The ground of the analog circuit will be also referred to as "analog ground", and the ground of the digital circuit will be also referred to as "digital ground". Particularly, the wiring related to the pixel array 310 has low resistance to the magnetic field noise because the magnetic field noise directly affects the pixel signal therein. In addition, wiring having lower impedance has lower resistance to the magnetic field noise because the induced current more easily flows in wiring having lower impedance. In the case where a distribution of voltage is generated in the closed loop of the analog ground, the pixel signal, which is an analog signal, changes in accordance with the ground potential distribution. The present inventors have found that the area of the closed loop of the analog ground may be reduced to prevent the occurrence of a pattern noise in an output image of the image pickup element 300, that is, to increase the resistance of the image pickup unit 400 to the magnetic field noise.

As illustrated in FIG. 3, the analog circuit 370 of the image pickup element 300 includes the pixel array 310 and the analog ground wiring 330 electrically connected to the pixel array 310. The wiring board 500 of the image pickup unit 400 according to the first exemplary embodiment includes a ground wiring portion 570 that serves as the ground as illustrated in FIG. 5. The ground wiring portion 570 includes a ground wiring 571 serving as a first ground wiring and a ground wiring 572 serving as a second ground wiring.

The ground wiring 571 is connected to a plurality of ground electrodes 531. FIG. 5 illustrates a pair of ground electrodes $531_1$ and $531_2$ arranged apart from each other in the X direction among the plurality of ground electrodes 531. The analog ground wiring 330 is connected to a plurality of analog ground electrodes 331. FIG. 5 illustrates a pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via a plurality of wires 611. The plurality of wires 611 are included in the plurality of wires 610 illustrated in FIG. 4. FIG. 5 illustrates, among the plurality of wires 611, a wire $611_1$ that electrically interconnects the analog ground electrode $331_1$ and the ground electrode $531_1$, and a wire $611_2$ that electrically interconnects the analog ground electrode $331_2$ and the ground electrode $531_2$.

In the image pickup unit 400, a closed loop L1 of analog ground is formed such that the closed loop L1 overlaps with the image pickup element 300 and the wiring board 500 when the image pickup unit 400 is viewed from the side, that is, when the image pickup unit 400 is viewed in the Y direction. In FIG. 5, the closed loop L1 is indicated by a two-dot chain line.

The closed loop L1 mainly includes the analog ground wiring 330 of the image pickup element 300 and the ground wiring 571 of the wiring board 500. Specifically, the closed loop L1 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571.

The ground wiring 572 is a part other than the ground wiring 571, that is, a part that does not contribute to the formation of the closed loop L1 of the analog ground as viewed in the Y direction. For example, as viewed in the Y direction, the ground wiring 572 includes a portion that forms the closed loop of the digital ground together with the digital ground wiring 350 of the image pickup element 300 illustrated in FIG. 3 and a portion that does not contribute to formation of any closed loop.

Here, the area of the closed loop L1 of the analog ground as viewed in the Y direction, that is, the area of a portion enclosed by the two-dot chain line in FIG. 5 is denoted by S1. The ground wiring 571 is disposed at a position further on the image pickup element 300 side than a center C1 of the wiring board 500 in the Z direction. The center C1 is a center between the two main surfaces 501 and 502, and is indicated by a one-dot chain line in FIG. 5. Since the entirety of the ground wiring 571 is disposed at a position further on the image pickup element 300 side than the center C1 of the wiring board 500 in the Z direction, the area S1 of the closed loop L1 of the analog ground can be reduced. Since the induced electromotive force generated in the closed loop L1 is proportional to the area S1 of the closed loop L1, the electromotive force generated in the closed loop L1 can be reduced by reducing the area S1. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

In the first exemplary embodiment, the ground wiring 571 is constituted by only one conductor pattern 505 serving as a first conductor pattern. The conductor pattern 505 is disposed in the conductor layer 1, which is a surface layer of the wiring board 500 on the side on which the image pickup element 300 is mounted. Since the conductor pattern 505 is disposed in the conductor layer 1, the area S1 of the closed loop L1 can be reduced as much as possible, disturbance of the image generated by the image pickup element 300 can be effectively suppressed, and thus the quality of the generated image can be further improved.

The ground wiring 572 includes a plurality of conductor patterns 506 serving as a plurality of second conductor patterns arranged with intervals therebetween, and a plurality of via conductors 508 serving as a plurality of third via conductors. The conductor patterns 506 are disposed in the conductor layers 2 to 8. The plurality of conductor patterns 506 are electrically interconnected via the plurality of via conductors 508.

Figure 6A:
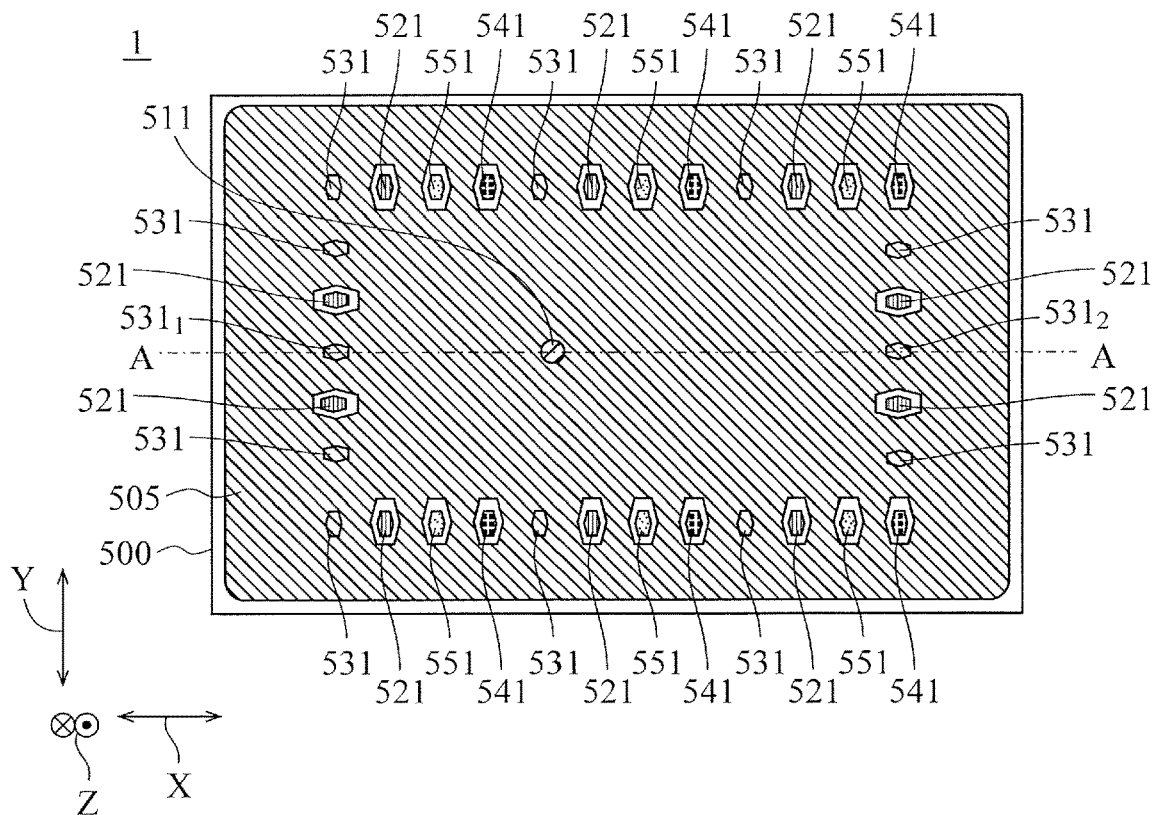
FIG. 6A is a plan view of a conductor layer of a wiring board according to the first exemplary embodiment.
Figure 6B:
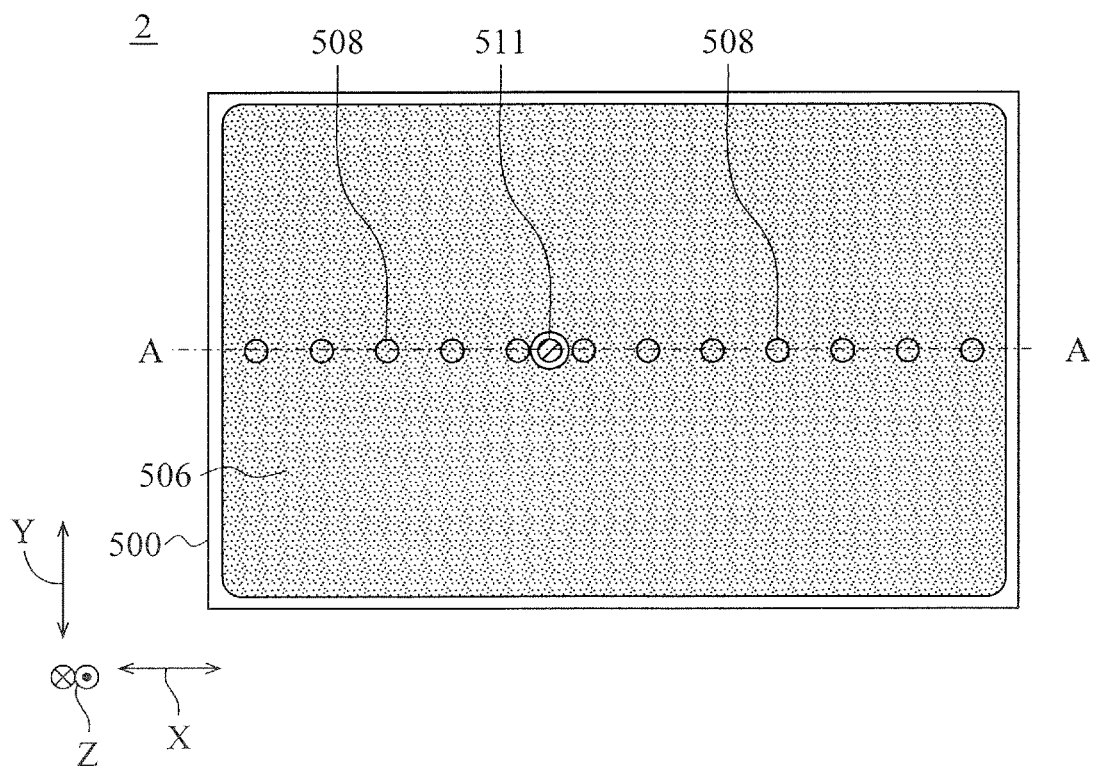
FIG. 6B is a plan view of a conductor layer of the wiring board according to the first exemplary embodiment.

FIG. 6A is a plan view of a first conductor layer of the wiring board 500 according to the first exemplary embodiment, that is, the conductor layer 1 serving as a surface layer. FIG. 6B is a plan view of a second conductor layer of the wiring board 500 according to the first exemplary embodiment, that is, the conductor layer 2 serving as an inner layer. As illustrated in FIG. 6A, power source electrodes 521 electrically connected to the analog power source electrodes 321 of FIG. 3 by wire bonding are disposed in the conductor layer 1. The power source electrodes 521 are electrically connected to an unillustrated conductor pattern disposed in any one of the conductor layers 2 to 8 via an unillustrated via conductor.

As illustrated in FIG. 6A, the ground electrodes 531 electrically connected to the analog ground electrodes 331 illustrated in FIG. 3 by wire bonding are disposed in the conductor layer 1. The ground electrodes 531 are formed integrally with the conductor pattern 505.

As illustrated in FIG. 6A, electrodes 541 electrically connected to the digital power source electrodes 341 or the signal electrode 361 illustrated in FIG. 3 by wire bonding are disposed in the conductor layer 1. The electrodes 541 are electrically connected to an unillustrated conductor pattern disposed in any one of the conductor layers 2 to 8 via an unillustrated via conductor.

As illustrated in FIG. 6A, ground electrodes 551 electrically connected to the digital ground electrodes 351 illustrated in FIG. 3 by wire bonding are disposed in the conductor layer 1. The ground electrodes 551 are electrically connected to the connector pattern 506 of the ground wiring 572 disposed in any one of the conductor layers 2 to 8 via an unillustrated via conductor. As illustrated in FIG. 6A, the conductor pattern 505 is a solid pattern whose outer shape as viewed in the Z direction is a quadrilateral shape or a quadrilateral shape having round corners. As illustrated in FIG. 6B, the conductor patterns 506 are each a solid pattern whose outer shape as viewed in the Z direction is a quadrilateral shape or a quadrilateral shape having round corners.

The ground of the analog circuit and the ground of the digital circuit of the image pickup element 300 are preferably integrated, and the ground wiring 571 and the ground wiring 572 are electrically interconnected in the wiring board 500 of FIG. 5. The ground wiring 571 is disposed at a position further on the image pickup element 300 side than the ground wiring 572. The ground wiring 571 and the ground wiring 572 are electrically interconnected via only one via conductor 511 serving as a first via conductor disposed at one position such that the closed loop L1 of the analog ground does not extend to the ground wiring 572. That is, the analog ground and the digital ground are interconnected via only the via conductor 511. In FIG. 5, the via conductor 511 is indicated by hatching different from that of the ground wiring 571 and 572.

The ground wiring 571 is electrically connected to the analog ground wiring 330 of the image pickup element 300, and the ground wiring 572 is electrically connected to the digital ground wiring 350 of the image pickup element 300 illustrated in FIG. 3. In addition, the ground wiring 571 and the ground wiring 572 are electrically interconnected via only the via conductor 511. Since the ground wiring 571 and the ground wiring 572 are electrically interconnected via only the one via conductor 511, the closed loop L1 of the analog ground does not extend to the ground wiring 572, and thus the area S1 can be reduced. As a result of this, disturbance of the image generated by the image pickup element 300 can be suppressed, and thus the quality of the generated image can be improved. By electrically connecting the digital ground wiring 350 of the image pickup element 300 to the ground wiring 572, the voltage fluctuation of the analog signal can be reduced as compared with the case where the digital ground wiring 350 is electrically connected to the ground wiring 571. As a result of this, disturbance of the image generated by the image pickup element 300 can be suppressed, and thus the quality of the generated image can be improved.

In the first exemplary embodiment, the via conductor 511 is disposed to penetrate through the conductor pattern 506 of the conductor layer 2 as illustrated in FIG. 6B, and electrically interconnects the conductor pattern 505 of the conductor layer 1 and the conductor pattern 506 of the conductor layer 3 as illustrated in FIG. 5.

To be noted, the conductor pattern 505 of the conductor layer 1 and the conductor pattern 506 of the conductor layer 3 electrically interconnected via the via conductor 511 have a structure similar to that of a planar antenna, and there is a possibility that an external electromagnetic wave is received and voltage fluctuation occurs in the wiring. Particularly, in the case where the via conductor 511 is positioned at a center or an end portion of the conductor pattern 505 of the conductor layer 1 and the conductor pattern 506 of the conductor layer 3 as viewed in the Z direction, the image pickup unit 400 is strongly affected by an electromagnetic wave of a specific frequency. Therefore, the via conductor 511 is disposed to be deviated from at least the center and end portion of the conductor pattern 505 of the conductor layer 1, which is the center and end portion of the conductor pattern 505 of the conductor layer 1 and the conductor pattern 506 of the conductor layer 3 in the first exemplary embodiment as viewed in the Z direction, that is, in a plan view. As a result of this, disturbance of the image generated by the image pickup element 300 can be suppressed, and thus the quality of the generated image can be further improved.

Second Exemplary Embodiment

Figure 7:
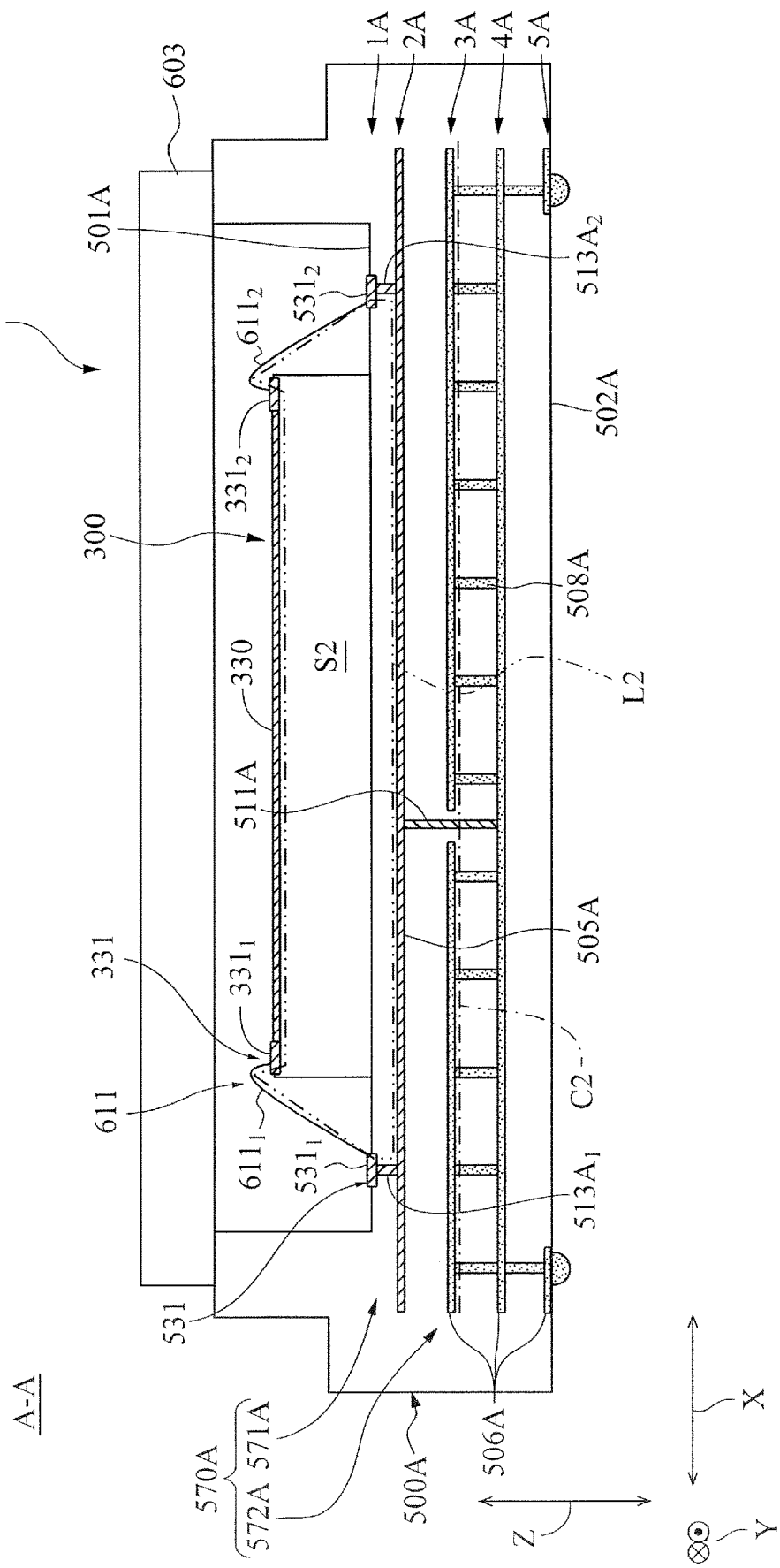
FIG. 7 is a section view of an image pickup unit according to a second exemplary embodiment.

An image pickup unit according to a second exemplary embodiment will be described. In the first exemplary embodiment, a case where the wiring board on which the semiconductor element is mounted is a printed wiring board has been described. In the second exemplary embodiment, a case where the wiring board on which the semiconductor element is mounted is a ceramic package will be described. FIG. 7 is a section view of an image pickup unit 400A according to the second exemplary embodiment. FIG. 7 schematically illustrates a section of the image pickup unit 400A in a side view taken along the line A-A of FIG. 4. To be noted, the constituents of the image pickup unit 400A of the second exemplary embodiment same as those of the image pickup unit 400 of the first exemplary embodiment will be denoted by the same reference signs and description thereof will be omitted.

As illustrated in FIG. 7, the image pickup unit 400A includes the image pickup element 300, a wiring board 500A, and the cover glass 603. The wiring board 500A is a ceramic package including a frame to which the cover glass 603 is attached. The wiring board 500A includes a conductor portion and an insulator portion. The conductor portion is formed from a conductive metal material, for example, copper or gold. The insulator portion is formed from an electrically insulating material, for example, ceramics.

The wiring board 500A is a layered board including a plurality of, for example, five conductor layers 1A to 5A arranged with intervals therebetween in the Z direction, which is the thickness direction of the wiring board 500A. An insulator layer is disposed between each two adjacent conductor layers among the conductor layers 1A to 5A. A conductor pattern is disposed in each of the conductor layers 1A to 5A. The wiring board 500A includes two main surfaces 501A and 502A. The image pickup element 300 is mounted on the main surface 501A on the conductor layer 1A side of the wiring board 500A.

The plurality of conductor layers 1A to 5A are disposed in a layered manner in the order of the conductor layer 1A, the conductor layer 2A, the conductor layer 3A, the conductor layer 4A, and the conductor layer 5A from the image pickup element 300 side. The conductor layers 1A and 5A are surface layers, that is, outer layers, and the conductor layers 2A to 4A are inner layers. To be noted, the number of the conductor layers is not limited to 5, and may be any number that is equal to or larger than 2. However, considering the arrangement of wiring, the number of conductor layers is preferably 3 or more, and more preferably 4 or more.

The image pickup element 300 is disposed on the main surface 501A and connected to the wiring board 500A via wire bonding. To be noted, although the image pickup element 300 is mounted on the wiring board 500A via wire bonding, the configuration is not limited to this, and the image pickup element 300 may be mounted on the wiring board 500A via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 7, the wiring board 500A includes a ground wiring portion 570A that serves as the ground. The ground wiring portion 570A includes a ground wiring 571A serving as a first ground wiring and a ground wiring 572A serving as a second ground wiring.

The ground wiring 571A is connected to the plurality of ground electrodes 531. The plurality of ground electrodes 531 are disposed in the conductor layer 1A. FIG. 7 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 7 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 7 illustrates, among the plurality of wires 611, the wire $611_1$ that electrically interconnects the analog ground electrode $331_1$ and the ground electrode $531_1$, and the wire $611_2$ that electrically interconnects the analog ground electrode $331_2$ and the ground electrode $531_2$.

In the image pickup unit 400A, a closed loop L2 of analog ground is formed such that the closed loop L2 overlaps with the image pickup element 300 and the wiring board 500A when the image pickup unit 400A is viewed from the side, that is, when the image pickup unit 400A is viewed in the Y direction. In FIG. 7, the closed loop L2 is indicated by a two-dot chain line.

The closed loop L2 mainly includes the analog ground wiring 330 of the image pickup element 300 and the ground wiring 571A of the wiring board 500A. Specifically, the closed loop L2 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571A.

The ground wiring 572A is a part other than the ground wiring 571A, that is, a part that does not contribute to the formation of the closed loop L2 of the analog ground as viewed in the Y direction. For example, as viewed in the Y direction, the ground wiring 572A includes a portion that forms the closed loop of the digital ground together with the digital ground wiring 350 of the image pickup element 300 illustrated in FIG. 3 and a portion that does not contribute to formation of any closed loop.

Here, the area of the closed loop L2 of the analog ground as viewed in the Y direction, that is, the area of a portion enclosed by the two-dot chain line in FIG. 7 is denoted by S2. The ground wiring 571A is disposed at a position further on the image pickup element 300 side than a center C2 of the wiring board 500A in the Z direction. The center C2 is a center between the two main surfaces 501A and 502A, and is indicated by a one-dot chain line in FIG. 7. Since the entirety of the ground wiring 571A is disposed at a position further on the image pickup element 300 side than the center C2 of the wiring board 500A in the Z direction, the area S2 of the closed loop L2 of the analog ground can be reduced. Since the induced electromotive force generated in the closed loop L2 is proportional to the area S2 of the closed loop L2, the electromotive force generated in the closed loop L2 can be reduced by reducing the area S2. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

The ground wiring 571A includes one conductor pattern 505A serving as a first conductor pattern. The conductor pattern 505A is disposed in the conductor layer 2A. In addition, the ground wiring 571A includes a via conductor $513A_1$ that interconnects the ground electrode $531_1$ and the conductor pattern 505A, and a via conductor $513A_2$ that interconnects the ground electrode $531_2$ and the conductor pattern 505A. The ground wiring 572A includes a plurality of conductor patterns 506A serving as a plurality of second conductor patterns disposed with intervals therebetween, and a plurality of via conductors 508A serving as a plurality of third via conductors. The conductor patterns 506A are disposed in the conductor layers 3A to 5A. The plurality of conductor patterns 506A are electrically interconnected via the plurality of via conductors 508A.

The ground of the analog circuit and the ground of the digital circuit of the image pickup element 300 are preferably integrated, and the ground wiring 571A and the ground wiring 572A are electrically interconnected in the wiring board 500A. The ground wiring 571A is disposed at a position further on the image pickup element 300 side than the ground wiring 572A. The ground wiring 571A and the ground wiring 572A are electrically interconnected via only the one via conductor 511A serving as a first via conductor disposed at one position such that the closed loop L2 of the analog ground does not extend to the ground wiring 572A. That is, the analog ground and the digital ground are interconnected via only the via conductor 511A. In FIG. 7, the via conductor 511A is indicated by hatching different from that of the ground wiring 571A and 572A.

The ground wiring 571A is electrically connected to the analog ground wiring 330 of the image pickup element 300, and the ground wiring 572A is electrically connected to the digital ground wiring 350 of the image pickup element 300 illustrated in FIG. 3. In addition, the ground wiring 571A and the ground wiring 572A are electrically interconnected via only one via conductor 511A. Since the ground wiring 571A and the ground wiring 572A are electrically interconnected via only the one via conductor 511A, the closed loop L2 of the analog ground does not extend to the ground wiring 572A, and thus the area S2 can be reduced. As a result of this, disturbance of the image generated by the image pickup element 300 can be suppressed, and thus the quality of the generated image can be improved.

In the second exemplary embodiment, the via conductor 511A is disposed to penetrate through the conductor pattern 506A in the conductor layer 3A, and electrically interconnects the conductor pattern 505A of the conductor layer 2A and the conductor pattern 506A of the conductor layer 4A.

The via conductor 511A is disposed to be deviated from at least the center and end portion of the conductor pattern 505A of the conductor layer 2A, which is the center and end portions of the conductor pattern 505A of the conductor layer 2A and the conductor pattern 506A of the conductor layer 4A in the second exemplary embodiment as viewed in the Z direction, that is, in a plan view. As a result of this, disturbance of the image generated by the image pickup element 300 can be suppressed, and thus the quality of the generated image can be improved.

Third Exemplary Embodiment

Figure 8:
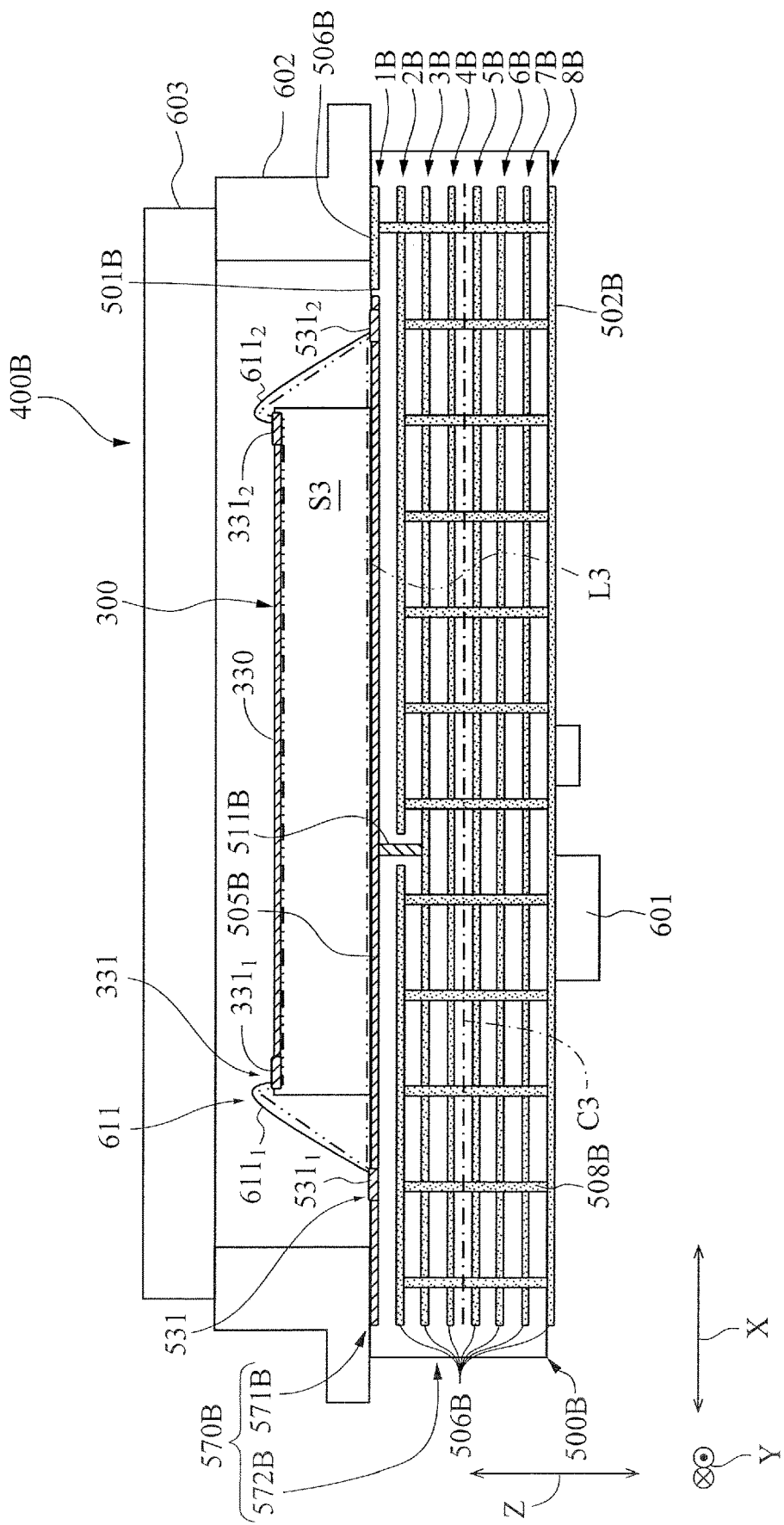
FIG. 8 is a section view of an image pickup unit according to a third exemplary embodiment.

An image pickup unit according to a third exemplary embodiment will be described. FIG. 8 is a section view of an image pickup unit 400B according to the third exemplary embodiment. FIG. 8 schematically illustrates a section of the image pickup unit 400B in a side view taken along the line A-A of FIG. 4. To be noted, the constituents of the image pickup unit 400B of the third exemplary embodiment same as those of the image pickup unit 400 of the first exemplary embodiment will be denoted by the same reference signs and description thereof will be omitted.

As illustrated in FIG. 8, the image pickup unit 400B includes the image pickup element 300, a wiring board 500B, the frame 602, and the cover glass 603. The wiring board 500B is a printed wiring board in the third exemplary embodiment. The wiring board 500B includes a conductor portion and an insulator portion. The conductor portion is formed from a conductive metal material, for example, copper or gold. The insulator portion is formed from an electrically insulating material, for example, an epoxy resin.

The wiring board 500B is a layered board including a plurality of, for example, eight conductor layers 1B to 8B arranged with intervals therebetween in the Z direction, which is the thickness direction of the wiring board 500B. An insulator layer is disposed between each two adjacent conductor layers among the conductor layers 1B to 8B. A conductor pattern is disposed in each of the conductor layers 1B to 8B. The wiring board 500B includes two main surfaces 501B and 502B. The image pickup element 300 is mounted on the main surface 501B on the conductor layer 1B side of the wiring board 500B.

The plurality of conductor layers 1B to 8B are disposed in a layered manner in the order of the conductor layer 1B, the conductor layer 2B, the conductor layer 3B, the conductor layer 4B, the conductor layer 5B, the conductor layer 6B, the conductor layer 7B, and the conductor layer 8B from the image pickup element 300 side. The conductor layers 1B and 8B are surface layers, that is, outer layers, and the conductor layers 2B to 7B are inner layers. The circuit component 601 such as a capacitor is mounted on the main surface 502B on the conductor layer 8B side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1B and 8B.

The image pickup element 300 is disposed on the main surface 501B and connected to the wiring board 500B via wire bonding. To be noted, although the image pickup element 300 is mounted on the wiring board 500B via wire bonding, the configuration is not limited to this, and the image pickup element 300 may be mounted on the wiring board 500B via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 8, the wiring board 500B includes a ground wiring portion 570B that serves as the ground. The ground wiring portion 570B includes a ground wiring 571B serving as a first ground wiring and a ground wiring 572B serving as a second ground wiring.

The ground wiring 571B is connected to the plurality of ground electrodes 531. The plurality of ground electrodes 531 are disposed in the conductor layer 1B. FIG. 8 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 8 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 8 illustrates, among the plurality of wires 611, the wire $611_1$ that electrically interconnects the analog ground electrode $331_1$ and the ground electrode $531_1$, and the wire $611_2$ that electrically interconnects the analog ground electrode $331_2$ and the ground electrode $531_2$.

In the image pickup unit 400B, a closed loop L3 of analog ground is formed such that the closed loop L3 overlaps with the image pickup element 300 and the wiring board 500B when the image pickup unit 400B is viewed from the side, that is, when the image pickup unit 400B is viewed in the Y direction. In FIG. 8, the closed loop L3 is indicated by a two-dot chain line.

The closed loop L3 mainly includes the analog ground wiring 330 of the image pickup element 300 and the ground wiring 571B of the wiring board 500B. Specifically, the closed loop L3 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571B.

The ground wiring 572B is a part other than the ground wiring 571B, that is, a part that does not contribute to the formation of the closed loop L3 of the analog ground as viewed in the Y direction. For example, as viewed in the Y direction, the ground wiring 572B includes a portion that forms the closed loop of the digital ground together with the digital ground wiring 350 of the image pickup element 300 illustrated in FIG. 3 and a portion that does not contribute to formation of any closed loop.

Here, the area of the closed loop L3 of the analog ground as viewed in the Y direction, that is, the area of a portion enclosed by the two-dot chain line in FIG. 8 is denoted by S3. The ground wiring 571B is disposed at a position further on the image pickup element 300 side than a center C3 of the wiring board 500B in the Z direction. The center C3 is a center between the two main surfaces 501B and 502B, and is indicated by a one-dot chain line in FIG. 8. Since the entirety of the ground wiring 571B is disposed at a position further on the image pickup element 300 side than the center C3 of the wiring board 500B in the Z direction, the area S3 of the closed loop L3 of the analog ground can be reduced. Since the induced electromotive force generated in the closed loop L3 is proportional to the area S3 of the closed loop L3, the electromotive force generated in the closed loop L3 can be reduced by reducing the area S3. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

The ground wiring 571B is constituted only by one conductor pattern 505B serving as a first conductor pattern. The conductor pattern 505B is disposed in the conductor layer 1B, which is a surface layer of the wiring board 500B on the side on which the image pickup element 300 is mounted. The ground electrodes 531 are formed integrally with the conductor pattern 505B. Since the conductor pattern 505B is disposed in the conductor layer 1B, the area S3 of the closed loop L3 can be reduced as much as possible, disturbance of the image generated by the image pickup element 300 can be effectively suppressed, and thus the quality of the generated image can be further improved.

The ground wiring 572B includes a plurality of conductor patterns 506B serving as a plurality of second conductor patterns arranged with intervals therebetween, and a plurality of via conductors 508B serving as a plurality of third via conductors. The conductor patterns 506B are disposed in the conductor layers 1B to 8B. The plurality of conductor patterns 506B are electrically interconnected via the plurality of via conductors 508B. The conductor pattern 506B of the conductor layer 1B is disposed at a position not included in the closed loop L3, that is, at such a position as not to contact the conductor pattern 505B. That is, in the conductor layer 1B, the conductor patterns 505B and 506B are disposed apart from each other. To be noted, the conductor pattern 506B of the conductor layer 1B may be formed integrally with an unillustrated ground electrode connected to the digital ground electrodes 351 illustrated in FIG. 3 by wire bonding.

The ground of the analog circuit and the ground of the digital circuit of the image pickup element 300 are preferably integrated, and the ground wiring 571B and the ground wiring 572B are electrically interconnected in the wiring board 500B. The ground wiring 571B and the ground wiring 572B are electrically interconnected via only one via conductor 511B serving as a first via conductor disposed at one position such that the closed loop of the analog ground does not extend to the ground wiring 572B. That is, the analog ground and the digital ground are interconnected via only the via conductor 511B. In FIG. 8, the via conductor 511B is indicated by hatching different from that of the ground wiring 571B and 572B.

The ground wiring 571B is electrically connected to the analog ground wiring 330 of the image pickup element 300, and the ground wiring 572B is electrically connected to the digital ground wiring 350 of the image pickup element 300 illustrated in FIG. 3. In addition, the ground wiring 571B and the ground wiring 572B are electrically interconnected via only the one via conductor 511B. Since the ground wiring 571B and the ground wiring 572B are electrically interconnected via only the one via conductor 511B, the closed loop L3 of the analog ground does not extend to the ground wiring 572B, and thus the area S3 can be reduced. As a result of this, disturbance of the image generated by the image pickup element 300 can be suppressed, and thus the quality of the generated image can be improved.

In the third exemplary embodiment, the via conductor 511B is disposed to penetrate through the conductor pattern 506B of the conductor layer 2B, and electrically interconnects the conductor pattern 505B of the conductor layer 1B and the conductor pattern 506B of the conductor layer 3B.

The via conductor 511B is disposed to be deviated from at least the center and end portion of the conductor pattern 505B of the conductor layer 1B, which is the center and end portions of the conductor pattern 505B of the conductor layer 1B and the conductor pattern 506B of the conductor layer 3B in the third exemplary embodiment as viewed in the Z direction. As a result of this, disturbance of the image generated by the image pickup element 300 can be effectively suppressed, and thus the quality of the generated image can be further improved.

Fourth Exemplary Embodiment

Figure 9:
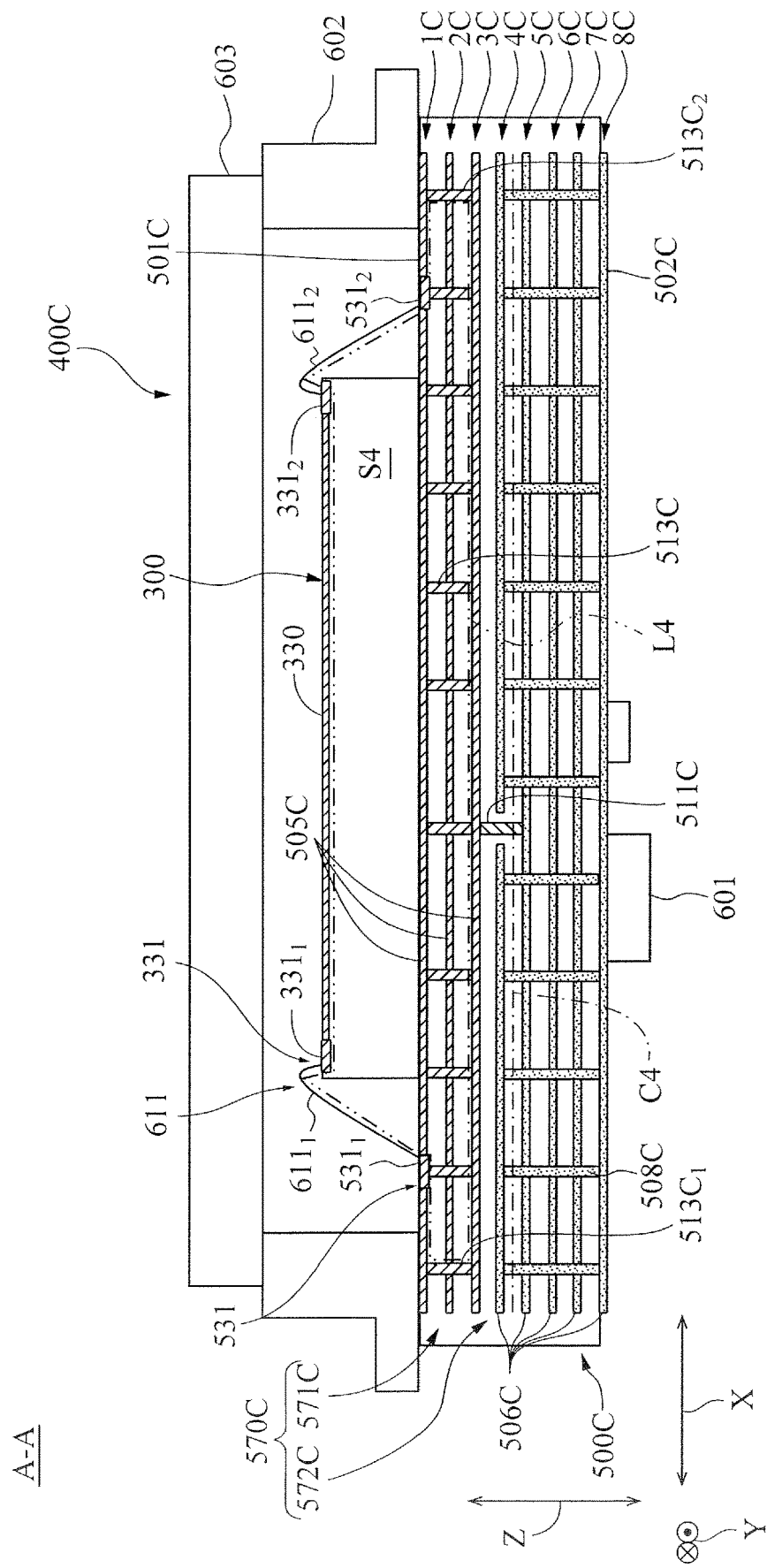
FIG. 9 is a section view of an image pickup unit according to a fourth exemplary embodiment.

An image pickup unit according to a fourth exemplary embodiment will be described. FIG. 9 is a section view of an image pickup unit 400C according to the fourth exemplary embodiment. FIG. 9 schematically illustrates a section of the image pickup unit 400C in a side view taken along the line A-A of FIG. 4. To be noted, the constituents of the image pickup unit 400C of the fourth exemplary embodiment same as those of the image pickup unit 400 of the first exemplary embodiment will be denoted by the same reference signs and description thereof will be omitted.

As illustrated in FIG. 9, the image pickup unit 400C includes the image pickup element 300, a wiring board 500C, the frame 602, and the cover glass 603. The wiring board 500C is a printed wiring board in the fourth exemplary embodiment. The wiring board 500C includes a conductor portion and an insulator portion. The conductor portion is formed from a conductive metal material, for example, copper or gold. The insulator portion is formed from an electrically insulating material, for example, an epoxy resin.

The wiring board 500C is a layered board including a plurality of, for example, eight conductor layers 1C to 8C arranged with intervals therebetween in the Z direction, which is the thickness direction of the wiring board 500C. An insulator layer is disposed between each two adjacent conductor layers among the conductor layers 1C to 8C. A conductor pattern is disposed in each of the conductor layers 1C to 8C. The wiring board 500C includes two main surfaces 501C and 502C. The image pickup element 300 is mounted on the main surface 501C on the conductor layer 1C side of the wiring board 500C.

The plurality of conductor layers 1C to 8C are disposed in a layered manner in the order of the conductor layer 1C, the conductor layer 2C, the conductor layer 3C, the conductor layer 4C, the conductor layer 5C, the conductor layer 6C, the conductor layer 7C, and the conductor layer 8C from the image pickup element 300 side. The conductor layers 1C and 8C are surface layers, that is, outer layers, and the conductor layers 2C to 7C are inner layers. The circuit component 601 such as a capacitor is mounted on the main surface 502C on the conductor layer 8C side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1C and 8C.

The image pickup element 300 is disposed on the main surface 501C and connected to the wiring board 500C via wire bonding. To be noted, although the image pickup element 300 is mounted on the wiring board 500C via wire bonding, the configuration is not limited to this, and the image pickup element 300 may be mounted on the wiring board 500C via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 9, the wiring board 500C includes a ground wiring portion 570C that serves as the ground. The ground wiring portion 570C includes a ground wiring 571C serving as a first ground wiring and a ground wiring 572C serving as a second ground wiring.

The ground wiring 571C is connected to the plurality of ground electrodes 531. The plurality of ground electrodes 531 are disposed in the conductor layer 1C. FIG. 9 illustrates the pair of ground electrodes $531_1$ and $531_2$ arranged apart from each other in the X direction among the plurality of ground electrodes 531. The analog ground wiring 330 is connected to a plurality of analog ground electrodes 331. FIG. 9 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 9 illustrates, among the plurality of wires 611, the wire $611_1$ that electrically interconnects the analog ground electrode $331_1$ and the ground electrode $531_1$, and the wire $611_2$ that electrically interconnects the analog ground electrode $331_2$ and the ground electrode $531_2$.

In the image pickup unit 400C, a closed loop L4 of analog ground is formed such that the closed loop L4 overlaps with the image pickup element 300 and the wiring board 500C when the image pickup unit 400C is viewed from the side, that is, when the image pickup unit 400C is viewed in the Y direction. In FIG. 9, the closed loop L4 is indicated by a two-dot chain line.

The closed loop L4 mainly includes the analog ground wiring 330 of the image pickup element 300 and the ground wiring 571C of the wiring board 500C. Specifically, the closed loop L4 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571C.

The ground wiring 572C is a part other than the ground wiring 571C, that is, a part that does not contribute to the formation of the closed loop L4 of the analog ground as viewed in the Y direction. For example, as viewed in the Y direction, the ground wiring 572C includes a portion that forms the closed loop of the digital ground together with the digital ground wiring 350 of the image pickup element 300 illustrated in FIG. 3 and a portion that does not contribute to formation of any closed loop.

Here, the area of the closed loop L4 of the analog ground as viewed in the Y direction, that is, the area of a portion enclosed by the two-dot chain line in FIG. 9 is denoted by S4. The ground wiring 571C is disposed at a position further on the image pickup element 300 side than a center C4 of the wiring board 500C in the Z direction. The center C4 is a center between the two main surfaces 501C and 502C, and is indicated by a one-dot chain line in FIG. 9. Since the entirety of the ground wiring 571C is disposed at a position further on the image pickup element 300 side than the center C4 of the wiring board 500C in the Z direction, the area S4 of the closed loop L4 of the analog ground can be reduced. Since the induced electromotive force generated in the closed loop L4 is proportional to the area S4 of the closed loop L4, the electromotive force generated in the closed loop L4 can be reduced by reducing the area S4. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

In the fourth exemplary embodiment, the ground wiring 571C includes a plurality of conductor patterns 505C serving as a plurality of first conductor patterns and a plurality of via conductors 513C serving as a plurality of second via conductors that interconnect the plurality of conductor patterns 505C. FIG. 9 illustrates three conductor patterns 505C as the plurality of conductor patterns 505C. At least one of the plurality of conductor patterns 505C is disposed in the conductor layer 1C, which is a surface layer of the wiring board 500C on the side on which the image pickup element 300 is mounted. The ground electrodes 531 are integrally formed with the conductor pattern 505C of the conductor layer 1C. The other two conductor patterns 505C are respectively disposed in the conductor layers 2C and 3C. Since the plurality of conductor patterns 505C are interconnected via the plurality of via conductors 513C, the induced current flows in the entirety of the plurality of the conductor patterns 505C at a frequency of a kHz band, that is, at a frequency of 1 kHz or higher and lower than 1 MHz. As a result of this, fluctuation of the ground voltage of the analog ground is effectively suppressed, occurrence of a pattern noise, that is, disturbance of the image generated by the image pickup element 300 can be effectively suppressed, and the quality of the generated image is further improved.

As illustrated in FIG. 9, the closed loop L4 is the largest closed loop among closed loops of the analog ground. Therefore, as viewed in the Y direction, the closed loop L4 includes a part of the conductor pattern 505C of the conductor layer 1C and a part of the conductor pattern 505C of the conductor layer 3C among the ground wiring 571C. In addition, as viewed in the Y direction, the closed loop L4 includes the two most separated via conductors $513C_1$ and $513C_2$ among the plurality of via conductors 513C interconnecting the conductor pattern 505C of the conductor layer 1C and the conductor pattern 505C of the conductor layer 3C.

The ground wiring 572C includes a plurality of conductor patterns 506C serving as a plurality of second conductor patterns disposed with intervals therebetween, and a plurality of via conductors 508C serving as a plurality of third via conductors. The conductor patterns 506C are disposed in the conductor layers 4C to 8C. The plurality of conductor patterns 506C are electrically interconnected via the plurality of via conductors 508C.

The ground of the analog circuit and the ground of the digital circuit of the image pickup element 300 are preferably integrated, and the ground wiring 571C and the ground wiring 572C are electrically interconnected in the wiring board 500C. The ground wiring 571C is disposed at a position further on the image pickup element 300 side than the ground wiring 572C. The ground wiring 571C and the ground wiring 572C are electrically interconnected via only one via conductor 511C serving as a first via conductor disposed at one position such that the closed loops of the analog ground do not extend to the ground wiring 572C. That is, the analog ground and the digital ground are interconnected via only the via conductor 511C. In FIG. 9, the via conductor 511C is indicated by hatching different from that of the ground wiring 571C and 572C.

The ground wiring 571C is electrically connected to the analog ground wiring 330 of the image pickup element 300, and the ground wiring 572C is electrically connected to the digital ground wiring 350 of the image pickup element 300 illustrated in FIG. 3. In addition, the ground wiring 571C and the ground wiring 572C are electrically interconnected via only the one via conductor 511C. Since the ground wiring 571C and the ground wiring 572C are electrically interconnected via only the one via conductor 511C, the closed loop L4 of the analog ground does not extend to the ground wiring 572C, and thus the area S4 can be reduced. As a result of this, disturbance of the image generated by the image pickup element 300 can be suppressed, and thus the quality of the generated image can be improved.

In the fourth exemplary embodiment, the via conductor 511C is disposed to penetrate through the conductor pattern 506C of the conductor layer 4C, and electrically interconnects the conductor pattern 505C of the conductor layer 3C and the conductor pattern 506C of the conductor layer 5C.

The via conductor 511C is disposed to be deviated from at least the center and end portion of the conductor patterns 505C of the conductor layer 3C, which is the center and end portions of the conductor pattern 505C of the conductor layer 3C and the conductor pattern 506C of the conductor layer 5C in the fourth exemplary embodiment as viewed in the Z direction. As a result of this, disturbance of the image generated by the image pickup element 300 can be suppressed, and thus the quality of the generated image can be further improved.

Fifth Exemplary Embodiment

Figure 10:
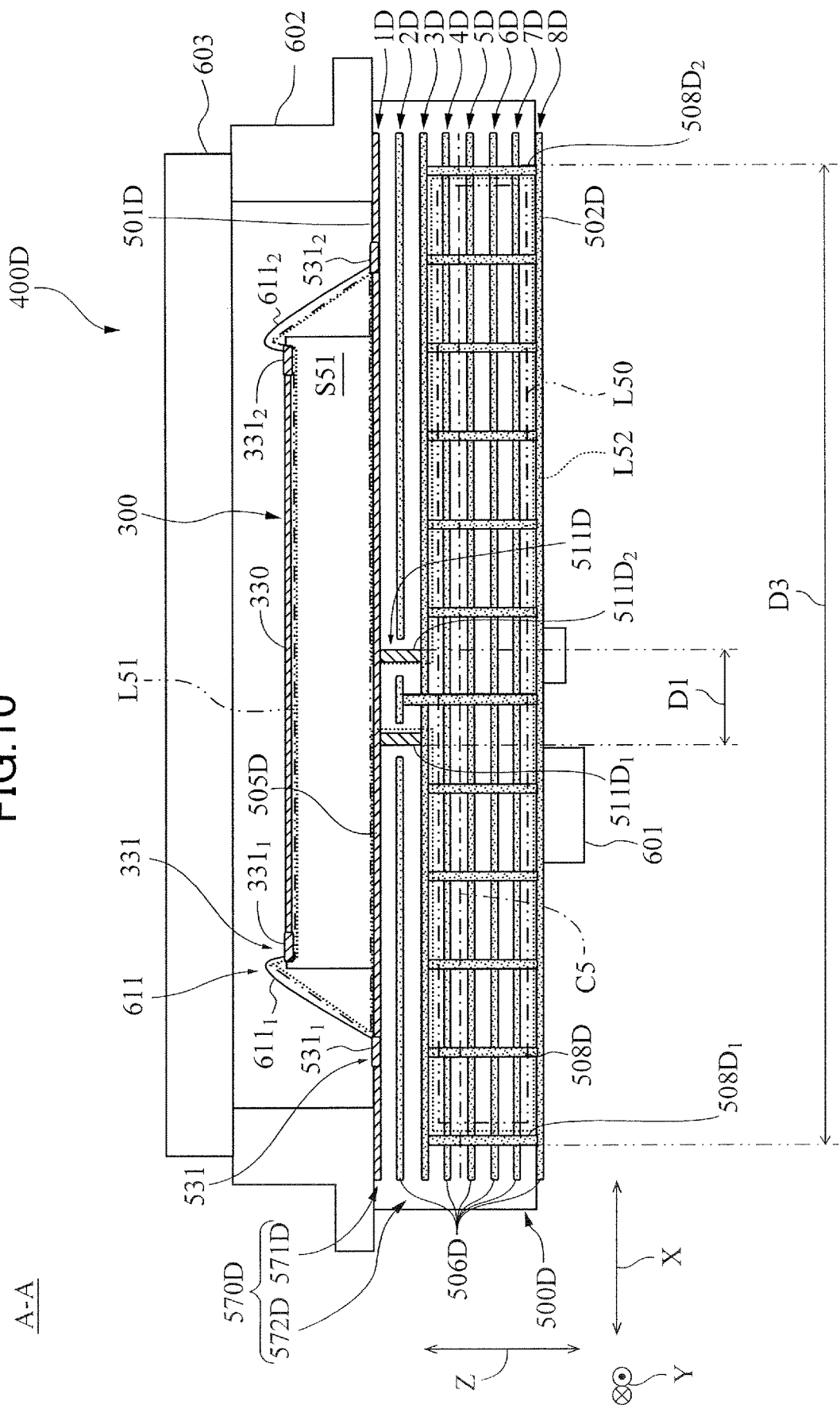
FIG. 10 is a section view of an image pickup unit according to a fifth exemplary embodiment.
Figure 11A:
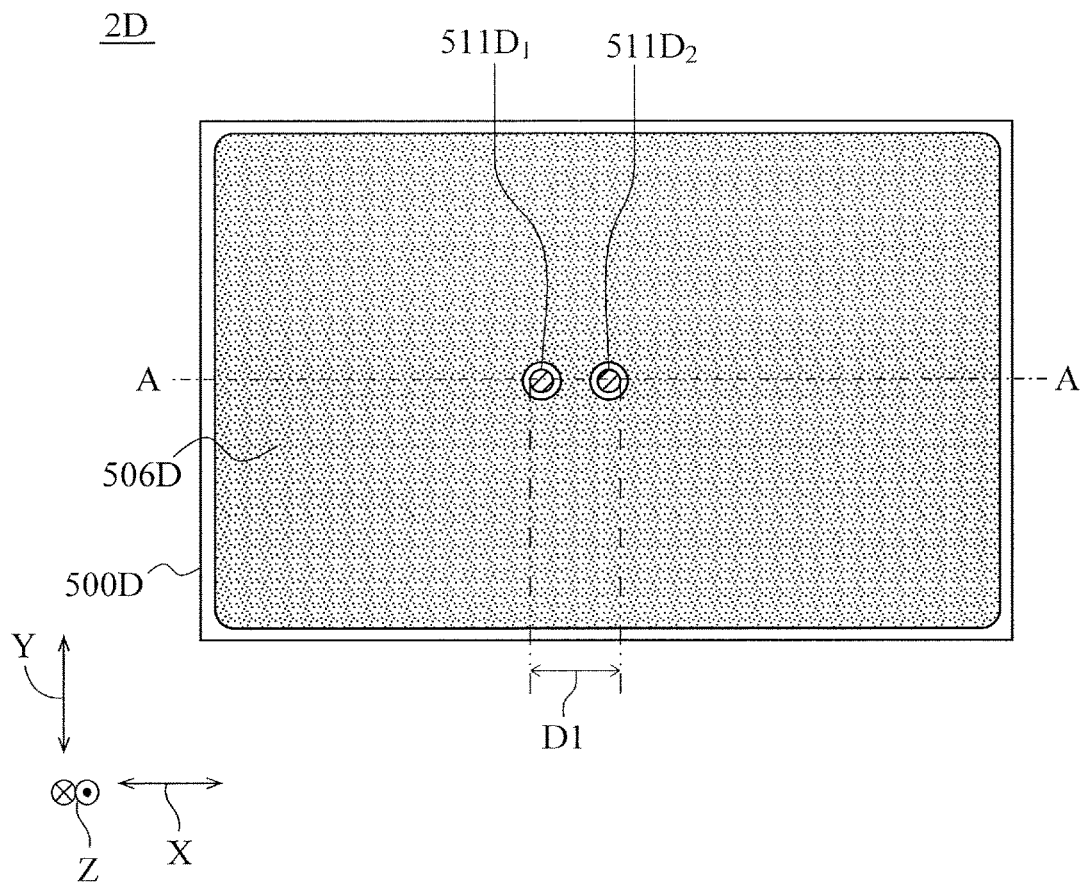
FIG. 11A is a plan view of a conductor layer of a wiring board according to the fifth exemplary embodiment.
Figure 11B:
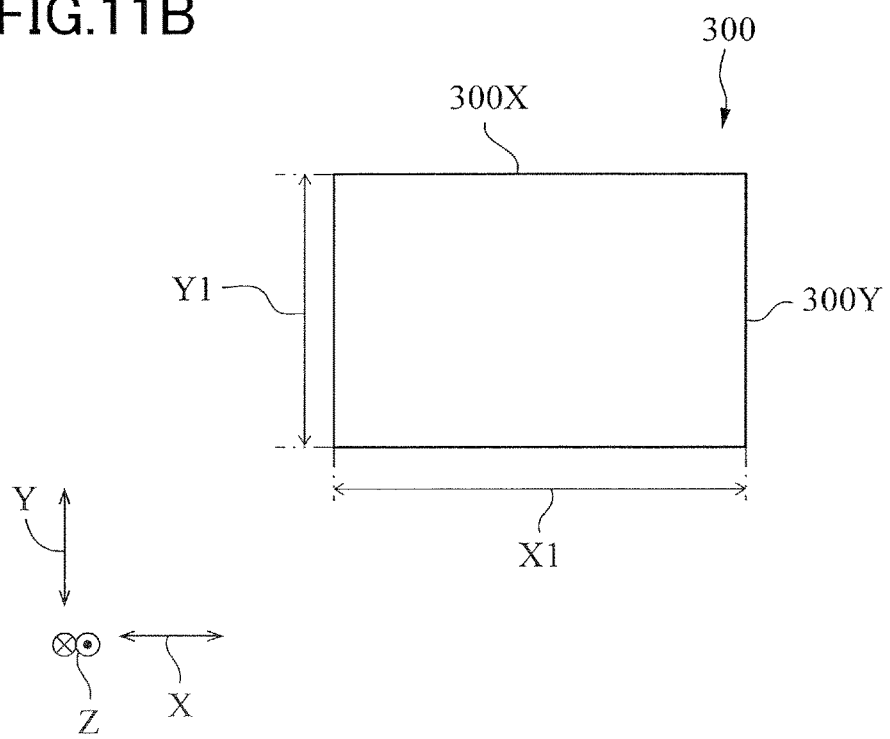
FIG. 11B is a schematic plan view of an image pickup element according to the fifth exemplary embodiment.

An image pickup unit according to a fifth exemplary embodiment will be described. In the first to fourth exemplary embodiments, cases where the first ground wiring and the second ground wiring are interconnected via only one first via conductor have been described. In the fifth exemplary embodiment, a case where the first ground wiring and the second ground wiring are interconnected via only a plurality of first via conductors will be described. FIG. 10 is a section view of an image pickup unit 400D according to the fifth exemplary embodiment. FIG. 11A is a plan view of a second conductor layer of a wiring board according to the fifth exemplary embodiment. FIG. 11B is a schematic plan view of the image pickup element 300. FIG. 10 schematically illustrates a section of the image pickup unit 400D in a side view taken along a line A-A of FIG. 11A. To be noted, the constituents of the image pickup unit 400D of the fifth exemplary embodiment same as those of the image pickup unit 400 of the first exemplary embodiment will be denoted by the same reference signs and description thereof will be omitted.

As illustrated in FIG. 10, the image pickup unit 400D includes the image pickup element 300, a wiring board 500D, the frame 602, and the cover glass 603. The wiring board 500D is a printed wiring board in the fifth exemplary embodiment. The wiring board 500D includes a conductor portion and an insulator portion. The conductor portion is formed from a conductive metal material, for example, copper or gold. The insulator portion is formed from an electrically insulating material, for example, an epoxy resin.

The wiring board 500D is a layered board including a plurality of, for example, eight conductor layers 1D to 8D arranged with intervals therebetween in the Z direction, which is the thickness direction of the wiring board 500D. An insulator layer is disposed between each two adjacent conductor layers among the conductor layers 1D to 8D. A conductor pattern is disposed in each of the conductor layers 1D to 8D. The wiring board 500D includes two main surfaces 501D and 502D. The image pickup element 300 is mounted on the main surface 501D on the conductor layer 1D side of the wiring board 500D.

The plurality of conductor layers 1D to 8D are disposed in a layered manner in the order of the conductor layer 1D, the conductor layer 2D, the conductor layer 3D, the conductor layer 4D, the conductor layer 5D, the conductor layer 6D, the conductor layer 7D, and the conductor layer 8D from the image pickup element 300 side. The conductor layers 1D and 8D are surface layers, that is, outer layers, and the conductor layers 2D to 7D are inner layers. The circuit component 601 such as a capacitor is mounted on the main surface 502D on the conductor layer 8D side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1D and 8D.

The image pickup element 300 is disposed on the main surface 501D and connected to the wiring board 500D via wire bonding. To be noted, although the image pickup element 300 is mounted on the wiring board 500D via wire bonding, the configuration is not limited to this, and the image pickup element 300 may be mounted on the wiring board 500D via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 10, the wiring board 500D includes a ground wiring portion 570D that serves as the ground. The ground wiring portion 570D includes a ground wiring 571D serving as a first ground wiring and a ground wiring 572D serving as a second ground wiring.

The ground wiring 571D is connected to the plurality of ground electrodes 531. The plurality of ground electrodes 531 are disposed in the conductor layer 1D. FIG. 10 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 10 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 10 illustrates, among the plurality of wires 611, the wire $611_1$ that electrically interconnects the analog ground electrode $331_1$ and the ground electrode $531_1$, and the wire $611_2$ that electrically interconnects the analog ground electrode $331_2$ and the ground electrode $531_2$.

In the image pickup unit 400D, a closed loop L51 of analog ground is formed such that the closed loop L51 overlaps with the image pickup element 300 and the wiring board 500D when the image pickup unit 400D is viewed from the side, that is, when the image pickup unit 400D is viewed in the Y direction. In FIG. 10, the closed loop L51 is indicated by a two-dot chain line.

The closed loop L51 mainly includes the analog ground wiring 330 of the image pickup element 300 and the ground wiring 571D of the wiring board 500D. Specifically, the closed loop L51 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571D.

The area of the closed loop L51 of the analog ground as viewed in the Y direction is denoted by S51. The ground wiring 571D is disposed at a position further on the image pickup element 300 side than a center C5 of the wiring board 500D in the Z direction. The center C5 is a center between the two main surfaces 501D and 502D, and is indicated by a one-dot chain line in FIG. 10. Since the entirety of the ground wiring 571D is disposed at a position further on the image pickup element 300 side than the center C5 of the wiring board 500D in the Z direction, the area S51 of the closed loop L51 of the analog ground can be reduced. Since the induced electromotive force generated in the closed loop L51 is proportional to the area S51 of the closed loop L51, the electromotive force generated in the closed loop L51 can be reduced by reducing the area S51. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

In the fifth exemplary embodiment, the ground wiring 571D is constituted only by one conductor pattern 505D serving as a first conductor pattern. The conductor pattern 505D is disposed in the conductor layer 1D, which is a surface layer of the wiring board 500D on the side on which the image pickup element 300 is mounted. The ground electrodes 531 are integrally formed with the conductor pattern 505D. Since the conductor pattern 505D is disposed in the conductor layer 1D, the area S51 of the closed loop L51 can be reduced as much as possible, disturbance of the image generated by the image pickup element 300 can be effectively suppressed, and thus the quality of the generated image can be further improved.

The ground wiring 572D includes a plurality of conductor patterns 506D serving as a plurality of second conductor patterns arranged with intervals therebetween, and a plurality of via conductors 508D serving as a plurality of third via conductors. The conductor patterns 506D are disposed in conductor layers 2D to 8D. The plurality of conductor patterns 506D are electrically interconnected via the plurality of via conductors 508D.

The ground of the analog circuit and the ground of the digital circuit of the image pickup element 300 are preferably integrated, and the ground wiring 571D and the ground wiring 572D are electrically interconnected in the wiring board 500D. The ground wiring 571D is disposed at a position further on the image pickup element 300 side than the ground wiring 572D. The ground wiring 571D and the ground wiring 572D are electrically interconnected via only a plurality of via conductors 511D serving as a plurality of first via conductors arranged with intervals therebetween. In the fifth exemplary embodiment, the plurality of via conductors 511D are composed of two via conductors $511D_1$ and $511D_2$. In FIG. 10, the via conductors 511D are indicated by hatching different from that of the ground wiring 571D and 572D.

The ground wiring 571D is electrically connected to the analog ground wiring 330 of the image pickup element 300, and the ground wiring 572D is electrically connected to the digital ground wiring 350 of the image pickup element 300 illustrated in FIG. 3. In addition, the ground wiring 571D and the ground wiring 572D are electrically interconnected via only the plurality of via conductors 511D. In this manner, the ground of the analog circuit and the ground of the digital circuit of the image pickup element 300 are integrated in the wiring board 500D.

Here, as a result of the ground wiring 571D and the ground wiring 572D being interconnected via the plurality of via conductors 511D, a closed loop L52 that partially overlaps with the closed loop L51 as viewed in the Y direction is formed. In FIG. 10, the closed loop L52 is indicated by a dotted line. The closed loop L52 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571D. Further, the closed loop L52 includes the two most separated via conductors $511D_1$ and $511D_2$ among the plurality of via conductors 511D, and the ground wiring 572D. That is, the closed loop L52 is a closed loop formed by interconnecting the closed loop L51 and a closed loop L50 formed in the ground wiring 572D via the plurality of via conductors 511D, and is larger than the closed loop L51.

The present inventors have found that the formed closed loop can be regarded as two separate loops of the closed loop L51 and the closed loop L50 if the interval between the plurality of via conductors 511D is small even in the case where the plurality of the via conductors 511D are provided. Here, the distance between the two most separated via conductors $511D_1$ and $511D_2$ among the plurality of via conductors 511D is denoted by D1. As illustrated in FIG. 11A, the distance D1 is a linear distance between a portion of the via conductor $511D_1$ farthest from the via conductor $511D_2$ and a portion of the via conductor $511D_2$ farthest from the via conductor $511D_1$.

The smaller the distance D1 is, the impedance of a portion of the conductor pattern 505D between the via conductors $511D_1$ and $511D_2$ is. The impedance of this portion becomes relatively smaller than the sum of the impedance of the via conductors $511D_1$ and $511D_2$ and the impedance of a portion of the ground wiring 572D corresponding to the closed loop L50 as the distance D1 becomes smaller. Therefore, it can be regarded that most of the induced current that passes and loops through the analog ground wiring 330 flows in the closed loop L51. Conversely, the impedance of the portion of the conductor pattern 505D between the via conductors $511D_1$ and $511D_2$ is larger when the distance D1 is larger. The impedance of this portion becomes closer to the sum of the impedance of the via conductors $511D_1$ and $511D_2$ and the impedance of a portion of the ground wiring 572D corresponding to the closed loop L50 as the distance D1 becomes larger. As a result of this, the induced current becomes more likely to shunt at the via conductors $511D_1$ and $511D_2$.

As illustrated in FIG. 11B, the image pickup element 300 has a rectangular outer shape as viewed in the Z direction. When the image pickup element 300 is viewed in the Z direction, that is, in a plan view, the length of a long side 300X serving as a first side of the image pickup element 300 is denoted by X1, and the length of a short side 300Y serving as a second side intersecting with the long side is denoted by Y1. The present inventors have found that the plurality of via conductors 511D may be arranged such that the distance D1 between the two most separated via conductors $511D_1$ and $511D_2$ satisfies the following formula.

$$D1 \le \frac{\sqrt{X1^2 + Y1^2}}{10}$$

In the fifth exemplary embodiment, since the plurality of via conductors 511D only include the two via conductors $511D_1$ and $511D_2$ as illustrated in FIG. 11A, the distance D1 between the two via conductors $511D_1$ and $511D_2$ may satisfy the formula described above.

The distance D1 satisfying the formula described above means that the plurality of via conductors 511D are disposed within a narrow range. As a result of the plurality of via conductors 511D being disposed within a narrow range, even in the case where the closed loop L52 apparently larger than the closed loop L51 is formed, the induced current that flows in the closed loop L52 is much smaller than the induced current that flows in the closed loop L51. Therefore, as a result of the plurality of via conductors 511D being arranged within a narrow range, the closed loop L51 can be regarded as the closed loop of the analog ground.

In addition, the distance D1 preferably satisfies the following formula because satisfying the following formula means that the plurality of via conductors 511D are arranged within an even narrower range.

$$D1 \le \frac{\sqrt{X1^2 + Y1^2}}{20}$$

As described above, according to the fifth exemplary embodiment, since the entirety of the ground wiring 571D is disposed at a position further on the image pickup element 300 side than the center C5 as illustrated in FIG. 10, the area of the closed loop L51 can be reduced. By reducing the area of the closed loop L51, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

Here, the distance between the two most separated via conductors $508D_1$ and $508D_2$ among the plurality of via conductors 508D in the ground wiring 572D is denoted by D3. The distance D3 is a linear distance between a portion of the via conductor $508D_1$ farthest from the via conductor $508D_2$ and a portion of the via conductor $508D_2$ farthest from the via conductor $508D_1$. In the fifth exemplary embodiment, the distance D1 is smaller than the distance D3. As a result of this, the plurality of via conductors 511D are arranged in a narrow range, and thus the induced current is more likely to flow in the closed loop L51 than in the closed loop L52. Therefore, disturbance of the image generated by the image pickup element 300 can be suppressed, and thus the quality of the generated image can be improved.

In the fifth exemplary embodiment, the via conductors 511D are disposed to penetrate through the conductor pattern 506D of the conductor layer 2D, and electrically interconnect the conductor pattern 505D of the conductor layer 1D and the conductor pattern 506D of the conductor layer 3D. Therefore, also in the fifth exemplary embodiment, similarly to the first to fourth exemplary embodiments, each via conductor 511D may be disposed to be deviated from the center and end portion of at least one of the conductor pattern 505D of the conductor layer 2D and the conductor pattern 506D of the conductor layer 3D as viewed in the Z direction. As a result of this, disturbance of the image generated by the image pickup element 300 can be suppressed, and thus the quality of the generated image can be further improved.

Sixth Exemplary Embodiment

Figure 12:
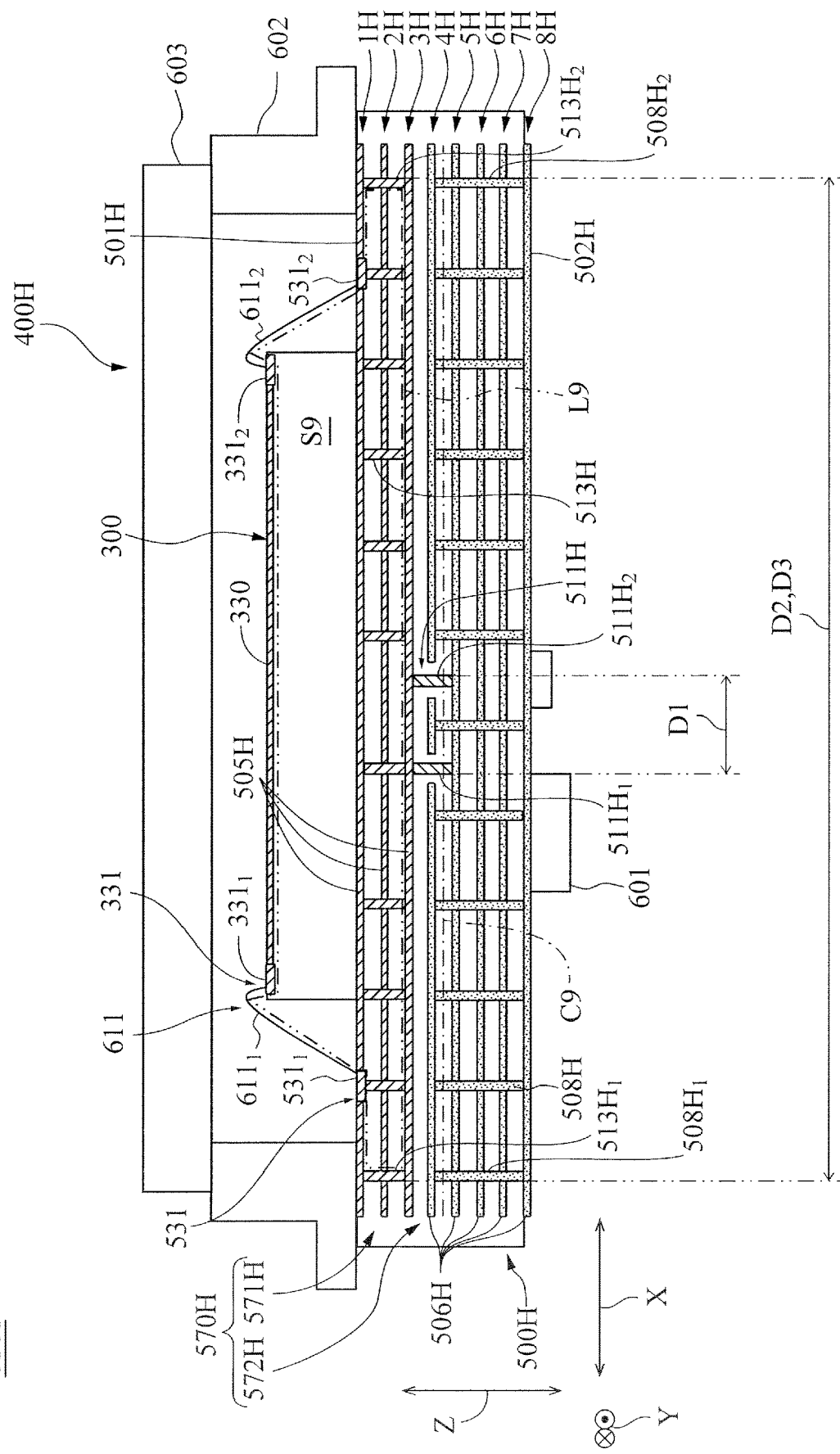
FIG. 12 is a section view of an image pickup unit according to a sixth exemplary embodiment.

An image pickup unit according to a sixth exemplary embodiment will be described. FIG. 12 is a section view of an image pickup unit 400H according to the sixth exemplary embodiment. FIG. 12 schematically illustrates a section of the image pickup unit 400H in a side view taken along the line A-A of FIG. 4. To be noted, the constituents of the image pickup unit 400H of the sixth exemplary embodiment same as those of the image pickup unit 400 of the first exemplary embodiment will be denoted by the same reference signs and description thereof will be omitted.

As illustrated in FIG. 12, the image pickup unit 400H includes the image pickup element 300, a wiring board 500H, the frame 602, and the cover glass 603. The wiring board 500H is a printed wiring board in the sixth exemplary embodiment. The wiring board 500H includes a conductor portion and an insulator portion. The conductor portion is formed from a conductive metal material, for example, copper or gold. The insulator portion is formed from an electrically insulating material, for example, an epoxy resin.

The wiring board 500H is a layered board including a plurality of, for example, eight conductor layers 1H to 8H arranged with intervals therebetween in the Z direction, which is the thickness direction of the wiring board 500H. An insulator layer is disposed between each two adjacent conductor layers among the conductor layers 1H to 8H. A conductor pattern is disposed in each of the conductor layers 1H to 8H. The wiring board 500H includes two main surfaces 501H and 502H. The image pickup element 300 is mounted on the main surface 501H on the conductor layer 1H side of the wiring board 500H.

The plurality of conductor layers 1H to 8H are disposed in a layered manner in the order of the conductor layer 1H, the conductor layer 2H, the conductor layer 3H, the conductor layer 4H, the conductor layer 5H, the conductor layer 6H, the conductor layer 7H, and the conductor layer 8H from the image pickup element 300 side. The conductor layers 1H and 8H are surface layers, that is, outer layers, and the conductor layers 2H to 7H are inner layers. The circuit component 601 such as a capacitor is mounted on the main surface 502H on the conductor layer 8H side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1H and 8H.

The image pickup element 300 is disposed on the main surface 501H and connected to the wiring board 500H via wire bonding. To be noted, although the image pickup element 300 is mounted on the wiring board 500H via wire bonding, the configuration is not limited to this, and the image pickup element 300 may be mounted on the wiring board 500H via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 12, the wiring board 500H includes a ground wiring portion 570H that serves as the ground. The ground wiring portion 570H includes a ground wiring 571H serving as a first ground wiring and a ground wiring 572H serving as a second ground wiring.

The ground wiring 571H is connected to the plurality of ground electrodes 531. The plurality of ground electrodes 531 are disposed in the conductor layer 1H. FIG. 12 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 12 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4.

FIG. 12 illustrates, among the plurality of wires 611, the wire 611$_1$ that electrically interconnects the analog ground electrode 331$_1$ and the ground electrode 531$_1$, and the wire 611$_2$ that interconnects the analog ground electrode 331$_2$ and the ground electrode 531$_2$.

In the image pickup unit 400H, a closed loop L9 of analog ground is formed such that the closed loop L9 overlaps with the image pickup element 300 and the wiring board 500H when the image pickup unit 400H is viewed from the side, that is, when the image pickup unit 400H is viewed in the Y direction. In FIG. 12, the closed loop L9 is indicated by a two-dot chain line.

The closed loop L9 mainly includes the analog ground wiring 330 of the image pickup element 300 and the ground wiring 571H of the wiring board 500H. Specifically, the closed loop L9 includes the analog ground wiring 330, the pair of analog ground electrodes 331$_1$ and 331$_2$, the pair of wires 611$_1$ and 611$_2$, the pair of ground electrodes 531$_1$ and 531$_2$, and the ground wiring 571H.

The area of the closed loop L9 of the analog ground as viewed in the Y direction, that is, the area of a portion enclosed by the two-dot chain line in FIG. 12 is denoted by S9. The ground wiring 571H is disposed at a position further on the image pickup element 300 side than a center C9 of the wiring board 500H in the Z direction. The center C9 is a center between the two main surfaces 501H and 502H, and is indicated by a one-dot chain line in FIG. 12. Since the entirety of the ground wiring 571H is disposed at a position further on the image pickup element 300 side than the center C9 of the wiring board 500H in the Z direction, the area S9 of the closed loop L9 of the analog ground can be reduced. Since the induced electromotive force generated in the closed loop L9 is proportional to the area S9 of the closed loop L9, the electromotive force generated in the closed loop L9 can be reduced by reducing the area S9. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

In the sixth exemplary embodiment, the ground wiring 571H includes a plurality of conductor patterns 505H serving as a plurality of first conductor patterns and a plurality of via conductors 513H serving as a plurality of second via conductors that interconnect the plurality of conductor patterns 505H. FIG. 12 illustrates three conductor patterns 505H. At least one of the plurality of conductor patterns 505H is disposed in the conductor layer 1H, which is a surface layer of the wiring board 500H on the side on which the image pickup element 300 is mounted. The other two conductor patterns 505H are respectively disposed in the conductor layers 2H and 3H. Since the plurality of conductor patterns 505H are interconnected via the plurality of via conductors 513H, the induced current flows in the entirety of the plurality of the conductor patterns 505H at a frequency of a kHz band, that is, at a frequency of 1 kHz or higher and lower than 1 MHz. As a result of this, fluctuation of the ground voltage of the analog ground is effectively suppressed, occurrence of a pattern noise, that is, disturbance of the image generated by the image pickup element 300 can be effectively suppressed, and the quality of the generated image is further improved.

As illustrated in FIG. 12, the closed loop L9 is the largest closed loop among closed loops of the analog ground. Therefore, as viewed in the Y direction, the closed loop L9 includes a part of the conductor pattern 505H of the conductor layer 1H and a part of the conductor pattern 505H of the conductor layer 3H among the ground wiring 571H. In addition, as viewed in the Y direction, the closed loop L9 includes the two most separated via conductors 513H$_1$ and 513H$_2$ among the plurality of via conductors 513H interconnecting the conductor pattern 505H of the conductor layer 1H and the conductor pattern 505H of the conductor layer 3H.

The ground wiring 572H includes a plurality of conductor patterns 506H serving as a plurality of second conductor patterns disposed with intervals therebetween, and a plurality of via conductors 508H serving as a plurality of third via conductors. The conductor patterns 506H are disposed in the conductor layers 4H to 8H. The plurality of conductor patterns 506H are electrically interconnected via the plurality of via conductors 508H.

The ground of the analog circuit and the ground of the digital circuit of the image pickup element 300 are preferably integrated, and the ground wiring 571H and the ground wiring 572H are electrically interconnected in the wiring board 500H. The ground wiring 571H is disposed at a position further on the image pickup element 300 side than the ground wiring 572H. In the sixth exemplary embodiment, the ground wiring 571H and the ground wiring 572H are electrically interconnected via only a plurality of first via conductors 511H serving as a plurality of first via conductors. That is, the analog ground and the digital ground are interconnected via only the plurality of via conductors 511H. In FIG. 12, the via conductors 511H are indicated by hatching different from that of the ground wiring 571H and 572H.

The ground wiring 571H is electrically connected to the analog ground wiring 330 of the image pickup element 300, and the ground wiring 572H is electrically connected to the digital ground wiring 350 of the image pickup element 300 illustrated in FIG. 3. In addition, the ground wiring 571H and the ground wiring 572H are electrically interconnected via only the plurality of via conductors 511H. In this manner, the ground of the analog circuit and the ground of the digital circuit of the image pickup element 300 are integrated in the wiring board 500H.

The distance between the two most separated via conductors 511H$_1$ and 511H$_2$ among the plurality of via conductors 511H is denoted by D1. The distance D1 is a linear distance between a portion of the via conductor 511H$_1$ farthest from the via conductor 511H$_2$ and a portion of the via conductor 511H$_2$ farthest from the via conductor 511H$_1$.

Similarly to the fifth exemplary embodiment described above, as illustrated in FIG. 11B, when the image pickup element 300 is viewed in the Z direction, that is, in a plan view, a length of a long side 300X serving as a first side of the image pickup element 300 is denoted by X1, and a length of a short side 300Y serving as a second side intersecting with the long side is denoted by Y1. As described in the fifth exemplary embodiment, the plurality of via conductors 511H may be arranged such that the distance D1 between the two most separated via conductors 511H$_1$ and 511H$_2$ satisfies the following formula.

$$D1 \le \frac{\sqrt{X1^2 + Y1^2}}{10}$$

In the sixth exemplary embodiment, since the plurality of via conductors 511H only include the two via conductors

511H₁ and 511H₂, the distance D1 between the two via conductors 511H₁ and 511H₂ may satisfy the formula described above.

The distance D1 satisfying the formula described above means that the plurality of via conductors 511H are disposed within a narrow range. As a result of the plurality of via conductors 511H being disposed within a narrow range, even in the case where a closed loop apparently larger than the closed loop L9 is formed, the induced current that flows in the larger closed loop is much smaller than the induced current that flows in the closed loop L9. Therefore, as a result of the plurality of via conductors 511H being arranged within a narrow range, the closed loop L9 can be regarded as the closed loop of the analog ground.

In addition, the distance D1 preferably satisfies the following formula because satisfying the following formula means that the plurality of via conductors 511H are arranged within an even narrower range.

$$D1 \leq \frac{\sqrt{X1^2 + Y1^2}}{20}$$

As described above, according to the sixth exemplary embodiment, since the entirety of the ground wiring 571H is disposed at a position further on the image pickup element 300 side than the center C9 as illustrated in FIG. 12, the area of the closed loop L9 can be reduced. By reducing the area of the closed loop L9, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

Here, the distance between the two most separated via conductors 513H₁ and 513H₂ among the plurality of via conductors 513H in the ground wiring 571H is denoted by D2. In addition, the distance between the two most separated via conductors 508H₁ and 508H₂ among the plurality of via conductors 508H in the ground wiring 572H is denoted by D3. The distance D2 is a linear distance between a portion of the via conductor 513H₁ farthest from the via conductor 513H₂ and a portion of the via conductor 513H₂ farthest from the via conductor 513H₁. The distance D3 is a linear distance between a portion of the via conductor 508H₁ farthest from the via conductor 508H₂ and a portion of the via conductor 508H₂ farthest from the via conductor 508H₁. In the sixth exemplary embodiment, the distance D1 is smaller than the distance D2 and the distance D3. As a result of this, the plurality of via conductors 511H are arranged in a narrow range, and thus the induced current is more likely to flow in the closed loop L9 than in a larger closed loop including the plurality of via conductors 511H. Therefore, disturbance of the image generated by the image pickup element 300 can be suppressed, and thus the quality of the generated image can be improved. To be noted, although the distance D2 is equal to the distance D3 in FIG. 12, these distances may be different from each other.

In the sixth exemplary embodiment, the via conductors 511H are disposed to penetrate through the conductor pattern 506H of the conductor layer 4H, and electrically interconnect the conductor pattern 505H of the conductor layer 3H and the conductor pattern 506H of the conductor layer 5H. Therefore, also in the sixth exemplary embodiment, similarly to the first to fourth exemplary embodiments, each via conductor 511H may be disposed to be deviated from the center and end portion of at least one of the conductor pattern 505H of the conductor layer 3H and the conductor pattern 506H of the conductor layer 5H as viewed in the Z direction. As a result of this, disturbance of the image generated by the image pickup element 300 can be suppressed, and thus the quality of the generated image can be further improved.

Seventh Exemplary Embodiment

Figure 13:
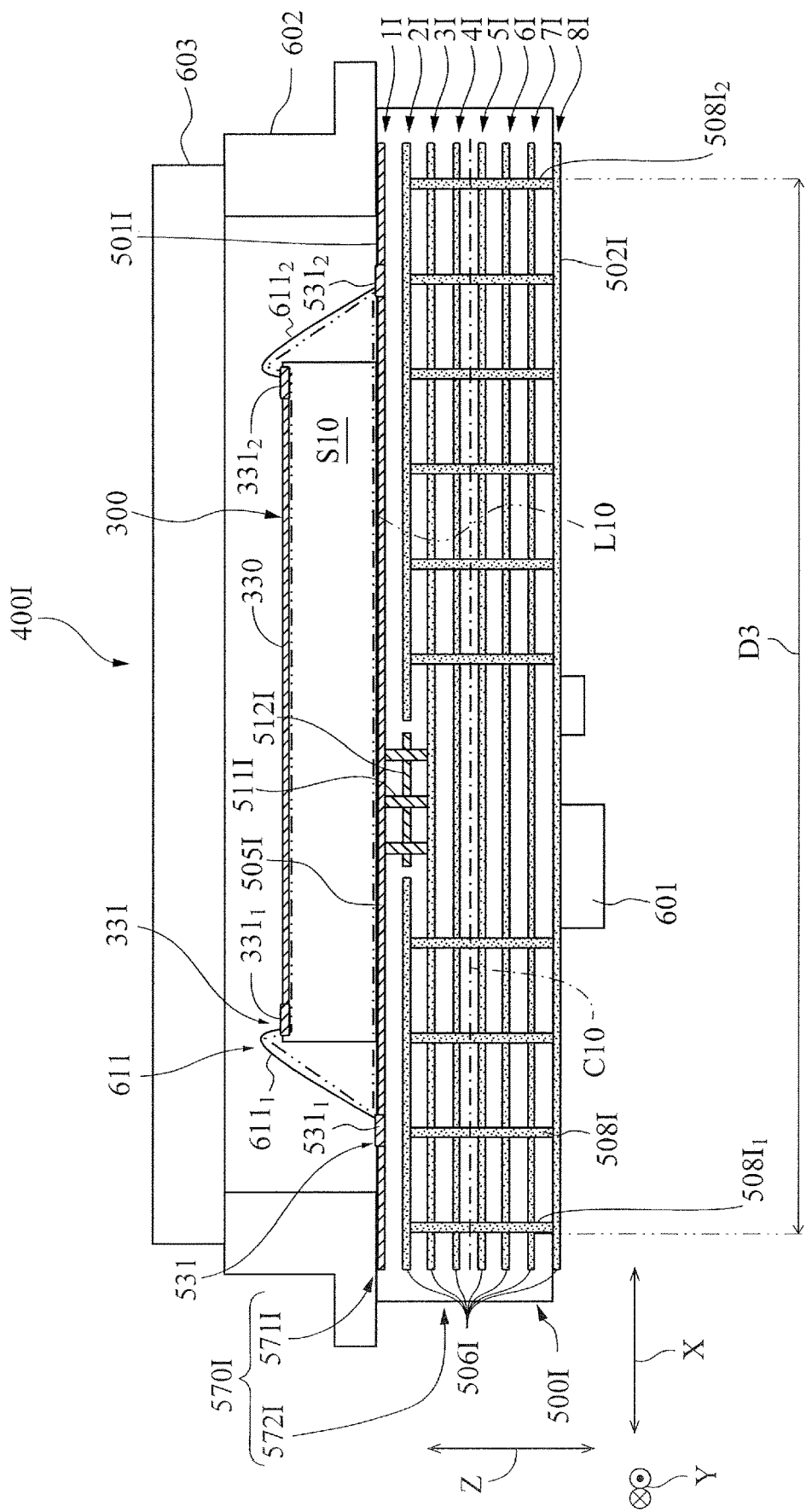
FIG. 13 is a section view of an image pickup unit according to a seventh exemplary embodiment.
Figure 14:
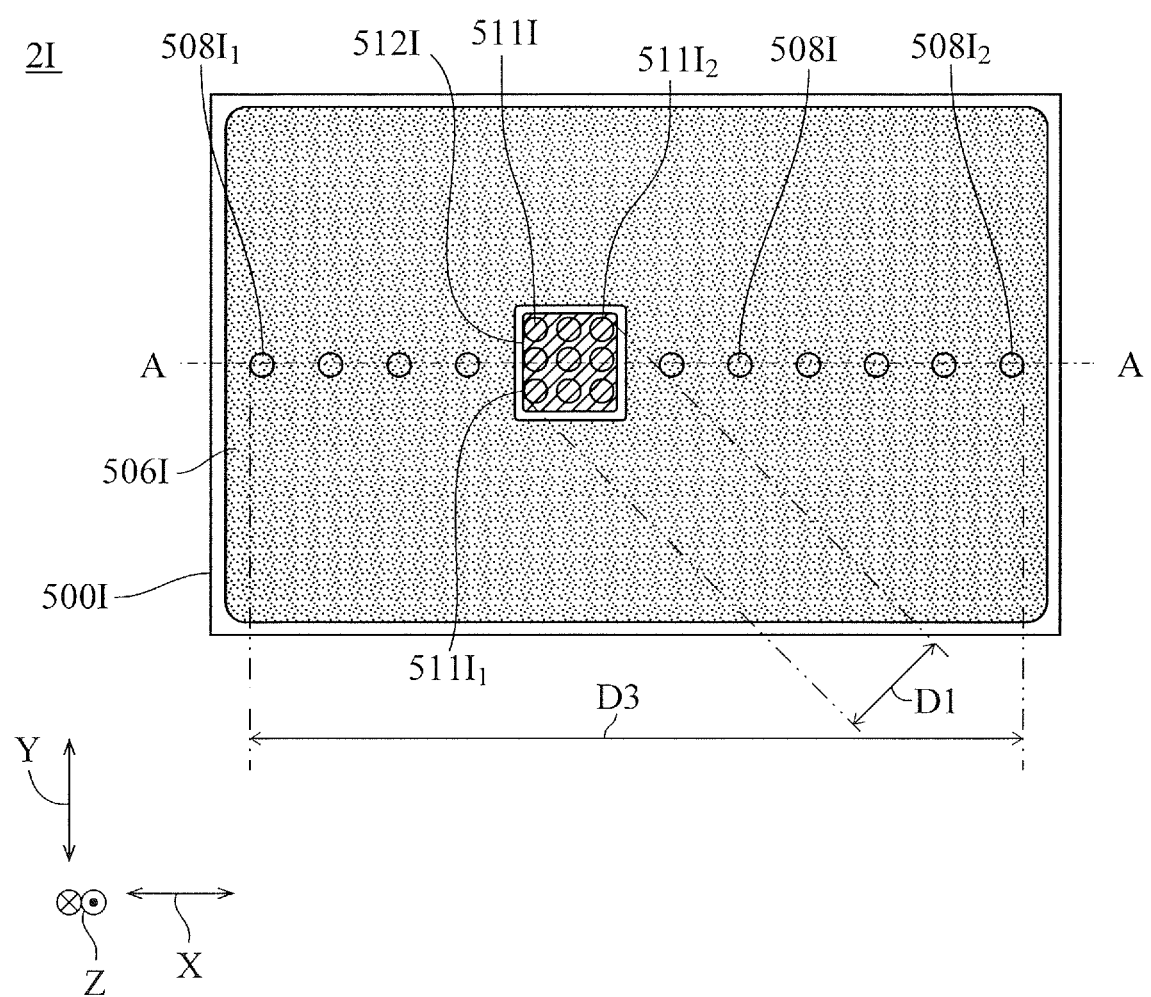
FIG. 14 is a plan view of a conductor layer of a wiring board according to the seventh exemplary embodiment.

An image pickup unit according to a seventh exemplary embodiment will be described. In the fifth exemplary embodiment described above, a case where the number of the via conductors 511D that interconnect the ground wiring 571D and the ground wiring 572D is 2 as illustrated in FIG. 10 has been described. However, the number is not limited to this, and may be 3 or more. FIG. 13 is a section view of an image pickup unit 400I according to the seventh exemplary embodiment. FIG. 14 is a plan view of a second conductor layer of a wiring board according to the seventh exemplary embodiment. FIG. 13 schematically illustrates a section of the image pickup unit 400I in a side view taken along a line A-A of FIG. 14. To be noted, the constituents of the image pickup unit 400I of the seventh exemplary embodiment same as those of the image pickup unit 400 of the first exemplary embodiment will be denoted by the same reference signs and description thereof will be omitted.

As illustrated in FIG. 13, the image pickup unit 400I includes the image pickup element 300, a wiring board 500I, the frame 602, and the cover glass 603. The wiring board 500I is a printed wiring board in the seventh exemplary embodiment. The wiring board 500I includes a conductor portion and an insulator portion. The conductor portion is formed from a conductive metal material, for example, copper or gold. The insulator portion is formed from an electrically insulating material, for example, an epoxy resin.

The wiring board 500I is a layered board including a plurality of, for example, eight conductor layers 1I to 8I arranged with intervals therebetween in the Z direction, which is the thickness direction of the wiring board 500I. An insulator layer is disposed between each two adjacent conductor layers among the conductor layers 1I to 8I. A conductor pattern is disposed in each of the conductor layers 1I to 8I. The wiring board 500I includes two main surfaces 501I and 502I. The image pickup element 300 is mounted on the main surface 501I on the conductor layer 1I side of the wiring board 500I.

The plurality of conductor layers 1I to 8I are disposed in a layered manner in the order of the conductor layer 1I, the conductor layer 2I, the conductor layer 3I, the conductor layer 4I, the conductor layer 5I, the conductor layer 6I, the conductor layer 7I, and the conductor layer 8I from the image pickup element 300 side. The conductor layers 1I and 8I are surface layers, that is, outer layers, and the conductor layers 2I to 7I are inner layers. The circuit component 601 such as a capacitor is mounted on the main surface 502I on the conductor layer 8I side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1I and 8I.

The image pickup element 300 is disposed on the main surface 501I and connected to the wiring board 500I via wire bonding. To be noted, although the image pickup element 300 is mounted on the wiring board 500I via wire bonding, the configuration is not limited to this, and the image pickup element 300 may be mounted on the wiring board 500I via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 13, the wiring board 500I includes a ground wiring portion 570I that serves as the ground. The ground wiring portion 570I includes a ground wiring 571I serving as a first ground wiring and a ground wiring 572I serving as a second ground wiring.

The ground wiring 571I is connected to the plurality of ground electrodes 531. The plurality of ground electrodes 531 are disposed in the conductor layer 1I. FIG. 13 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 13 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 13 illustrates, among the plurality of wires 611, the wire $611_1$ that electrically interconnects the analog ground electrode $331_1$ and the ground electrode $531_1$, and the wire $611_2$ that electrically interconnects the analog ground electrode $331_2$ and the ground electrode $531_2$.

In the image pickup unit 400I, a closed loop L10 of analog ground is formed such that the closed loop L10 overlaps with the image pickup element 300 and the wiring board 500I when the image pickup unit 400I is viewed from the side, that is, when the image pickup unit 400I is viewed in the Y direction. In FIG. 13, the closed loop L10 is indicated by a two-dot chain line.

The closed loop L10 mainly includes the analog ground wiring 330 of the image pickup element 300 and the ground wiring 571I of the wiring board 500I. Specifically, the closed loop L10 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571I.

The area of the closed loop L10 of the analog ground as viewed in the Y direction is denoted by S10. The ground wiring 571I is disposed at a position further on the image pickup element 300 side than a center C10 of the wiring board 500I in the Z direction. The center C10 is a center between the two main surfaces 501I and 502I, and is indicated by a one-dot chain line in FIG. 13. Since the entirety of the ground wiring 571I is disposed at a position further on the image pickup element 300 side than the center C10 of the wiring board 500I in the Z direction, the area S10 of the closed loop L10 of the analog ground can be reduced. Since the induced electromotive force generated in the closed loop L10 is proportional to the area S10 of the closed loop L10, the electromotive force generated in the closed loop L10 can be reduced by reducing the area S10. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

In the seventh exemplary embodiment, the ground wiring 571I is constituted by only one conductor pattern 505I serving as a first conductor pattern. The conductor pattern 505I is disposed in the conductor layer 1I, which is a surface layer of the wiring board 500I on the side on which the image pickup element 300 is mounted. The ground electrodes 531 are integrally formed with the conductor pattern 505I. Since the conductor pattern 505I is disposed in the conductor layer 1I, the area S10 of the closed loop L10 can be reduced as much as possible, disturbance of the image generated by the image pickup element 300 can be effectively suppressed, and thus the quality of the generated image can be further improved.

The ground wiring 572I includes a plurality of conductor patterns 506I serving as a plurality of second conductor patterns arranged with intervals therebetween, and a plurality of via conductors 508I serving as a plurality of third via conductors. The conductor patterns 506I are disposed in the conductor layers 2I to 8I. The plurality of conductor patterns 506I are electrically interconnected via the plurality of via conductors 508I.

The ground of the analog circuit and the ground of the digital circuit of the image pickup element 300 are preferably integrated, and the ground wiring 571I and the ground wiring 572I are electrically interconnected in the wiring board 500I. The ground wiring 571I is disposed at a position further on the image pickup element 300 side than the ground wiring 572I. In the seventh exemplary embodiment, the ground wiring 571I and the ground wiring 572I are electrically interconnected via only a plurality of via conductors 511I serving as a plurality of first via conductors. That is, analog ground and the digital ground are interconnected via only the plurality of via conductors 511I. In FIG. 13, the via conductors 511I are indicated by hatching different from that of the ground wiring 571I and 572I.

The ground wiring 571I is electrically connected to the analog ground wiring 330 of the image pickup element 300, and the ground wiring 572I is electrically connected to the digital ground wiring 350 of the image pickup element 300 illustrated in FIG. 3. In addition, the ground wiring 571I and the ground wiring 572I are electrically interconnected via only the plurality of via conductors 511I. In this manner, the ground of the analog circuit and the ground of the digital circuit of the image pickup element 300 are integrated in the wiring board 500I.

Here, as illustrated in FIG. 14, the distance between the two most separated via conductors $511I_1$ and $511I_2$ among the plurality of via conductors 511I is denoted by D1. The distance D1 is a linear distance between a portion of the via conductor $511I_1$ farthest from the via conductor $511I_2$ and a portion of the via conductor $511I_2$ farthest from the via conductor $511I_1$.

Similarly to the fifth exemplary embodiment described above, as illustrated in FIG. 11B, when the image pickup element 300 is viewed in the Z direction, that is, in a plan view, the length of the long side 300X serving as a first side of the image pickup element 300 is denoted by X1, and the length of the short side 300Y serving as a second side intersecting with the long side is denoted by Y1. As described in the fifth exemplary embodiment, the plurality of via conductors 511I may be arranged such that the distance D1 between the two most separated via conductors $511I_1$ and $511I_2$ satisfies the following formula.

$$D1 \le \frac{\sqrt{X1^2 + Y1^2}}{10}$$

In the seventh exemplary embodiment, since nine via conductors 511I arranged in three rows and three columns are provided as illustrated in FIG. 14, the distance D1 between the two via conductors 511I$_1$ and 511I$_2$ disposed at opposite corners among the nine via conductors 511I may satisfy the formula described above.

The distance D1 satisfying the formula described above means that the plurality of via conductors 511I are disposed within a narrow range. As a result of the plurality of via conductors 511I being disposed within a narrow range, even in the case where a closed loop apparently larger than the closed loop L10 is formed, the induced current that flows in the larger closed loop is much smaller than the induced current that flows in the closed loop L10. Therefore, as a result of the plurality of via conductors 511I being arranged within a narrow range, the closed loop L10 can be regarded as the closed loop of the analog ground.

In addition, the distance D1 preferably satisfies the following formula because satisfying the following formula means that the plurality of via conductors 511I are arranged within an even narrower range.

$$D1 \le \frac{\sqrt{X1^2 + Y1^2}}{20}$$

As described above, according to the seventh exemplary embodiment, since the entirety of the ground wiring 571I is disposed at a position further on the image pickup element 300 side than the center C10 as illustrated in FIG. 13, the area of the closed loop L10 can be reduced. By reducing the area of the closed loop L10, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

The distance between the two most separated via conductors 508I$_1$ and 508I$_2$ among the plurality of via conductors 508I in the ground wiring 572I is denoted by D3. The distance D3 is a linear distance between a portion of the via conductor 508I$_1$ farthest from the via conductor 508I$_2$ and a portion of the via conductor 508I$_2$ farthest from the via conductor 508I$_1$. In the seventh exemplary embodiment, the distance D1 is smaller than the distance D3. As a result of this, the plurality of via conductors 511I are arranged in a narrow range, and thus the induced current is more likely to flow in the closed loop L10 than in a larger closed loop including the plurality of via conductors 511I. Therefore, disturbance of the image generated by the image pickup element 300 can be suppressed, and thus the quality of the generated image can be improved.

In the seventh exemplary embodiment, the plurality of via conductors 511I are passed through one hole defined in the conductor pattern 506I of the conductor layer 2I as illustrated in FIG. 14. Further, the plurality of via conductors 511I electrically interconnect the conductor pattern 505I of the conductor layer 1I and the conductor pattern 506I of the conductor layer 3I as illustrated in FIG. 13.

The wiring board 500I of FIG. 13 includes a conductor pattern 512I disposed in an opening defined in the conductor pattern 506I of the conductor layer 2I out of contact with the conductor pattern 506I of the conductor layer 2I as illustrated in FIG. 14. The conductor pattern 512I is an example of a third conductor pattern. The conductor pattern 512I is disposed in the conductor layer 2I, and interconnects the plurality of via conductors 511I. As a result of this, middle portions of the plurality of via conductors 511I in the Z direction are electrically interconnected via the conductor pattern 512I.

In the seventh exemplary embodiment, the plurality of via conductors 511I are disposed to penetrate through the conductor pattern 506I of the conductor layer 2I, and electrically interconnect the conductor pattern 505I of the conductor layer 1I and the conductor pattern 506I of the conductor layer 3I.

The plurality of via conductors 511I are disposed to be deviated from at least the center and end portion of the conductor pattern 505I of the conductor layer 1I, which is the center and end portions of the conductor pattern 505I of the conductor layer 1I and the conductor pattern 506I of the conductor layer 3I in the seventh exemplary embodiment as viewed in the Z direction. As a result of this, disturbance of the image generated by the image pickup element 300 can be suppressed, and thus the quality of the generated image can be further improved.

To be noted, the ground wiring 571I of the seventh exemplary embodiment may be configured similarly to the ground wiring 571H of FIG. 12 described in the sixth exemplary embodiment. In this case, the distance D1 may be smaller than the distance D2 of FIG. 12 similarly to the sixth exemplary embodiment.

Eighth Exemplary Embodiment

Figure 15:
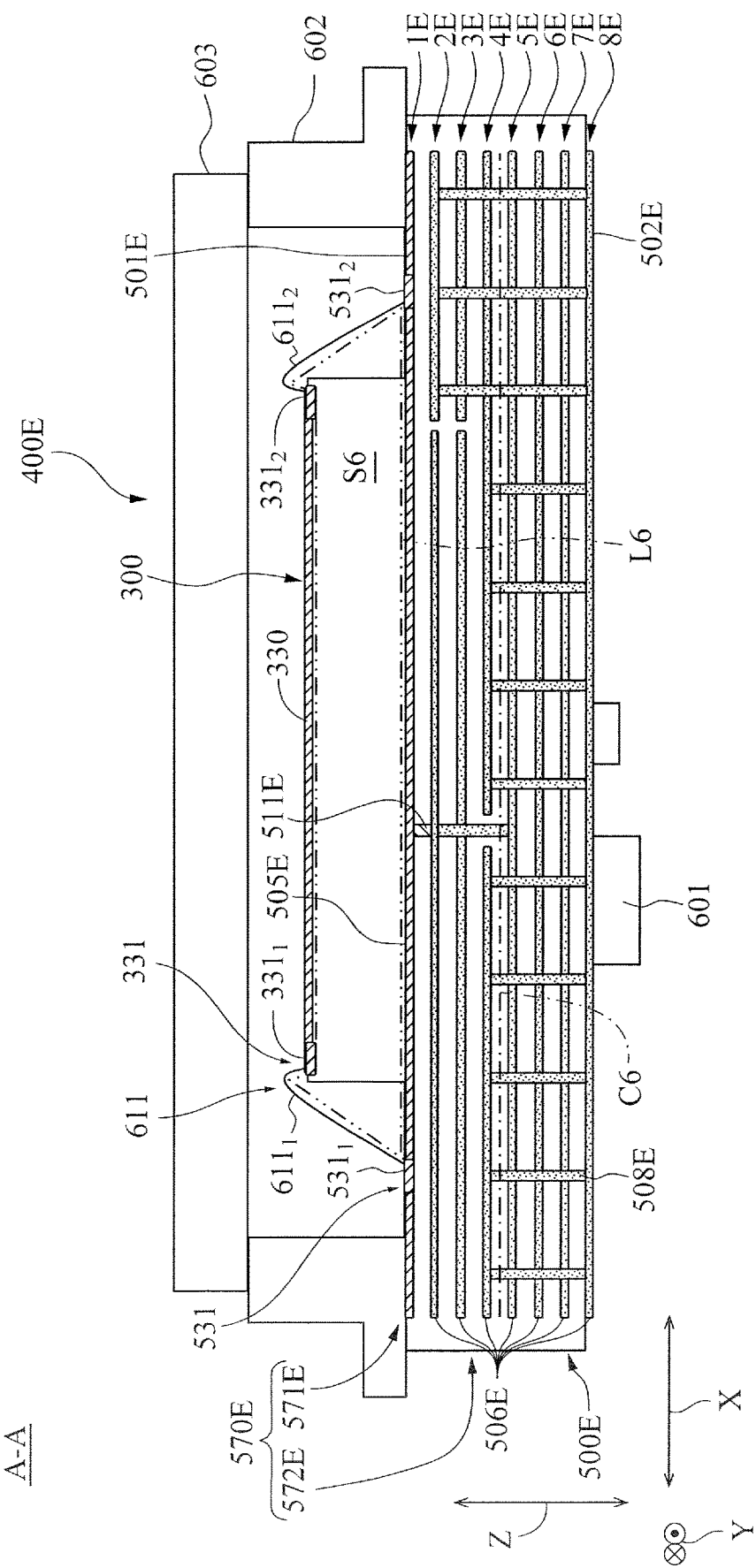
FIG. 15 is a section view of an image pickup unit according to an eighth exemplary embodiment.
Figure 16:
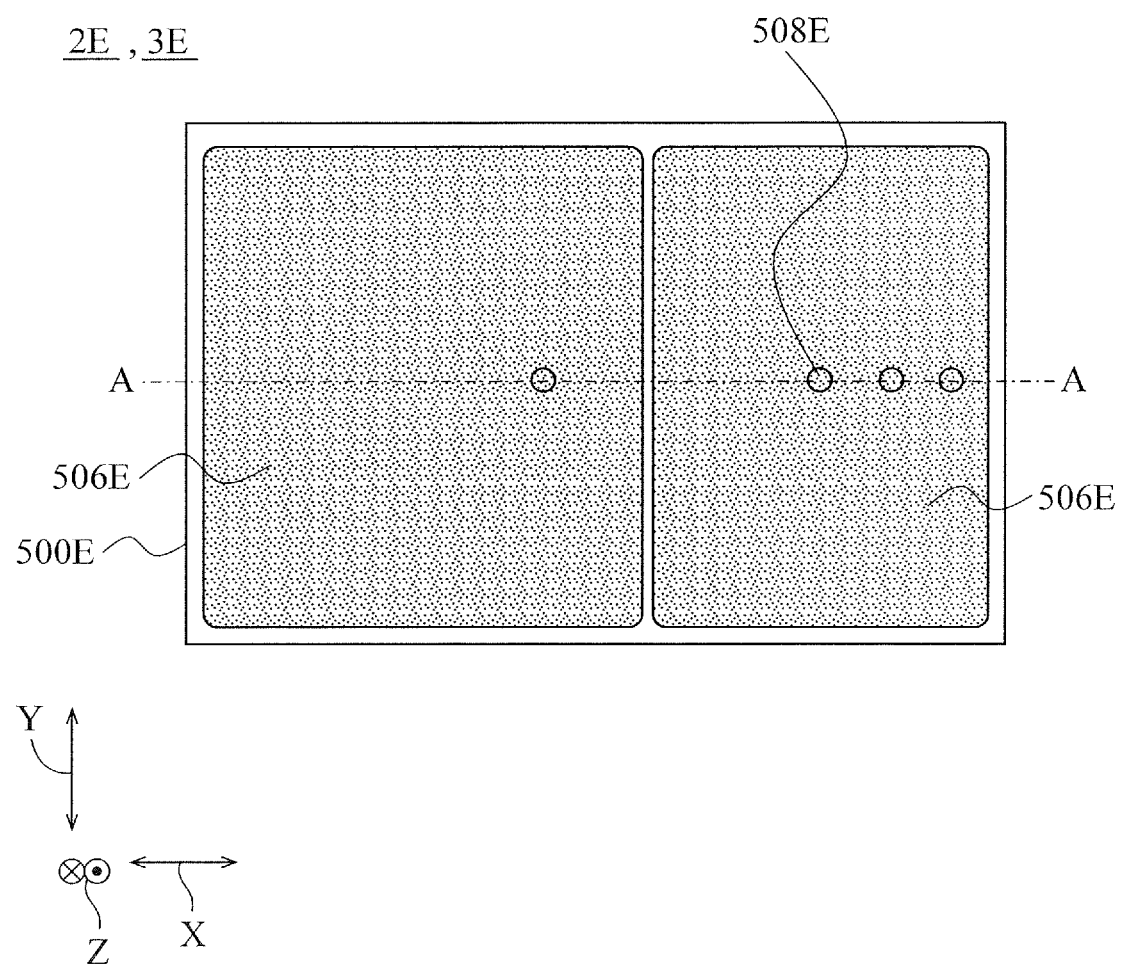
FIG. 16 is a plan view of a conductor layer of a wiring board according to the eighth exemplary embodiment.

An image pickup unit according to an eighth exemplary embodiment will be described. In the eighth exemplary embodiment, a case where a plurality of conductor patterns of the second ground wiring are disposed in any one of the conductor layers will be described. FIG. 15 is a section view of an image pickup unit 400E according to the eighth exemplary embodiment. FIG. 16 is a plan view of a second conductor layer and a third conductor layer of a wiring board according to the eighth exemplary embodiment. FIG. 15 schematically illustrates a section of the image pickup unit 400E in a side view taken along a line A-A of FIG. 16. To be noted, the constituents of the image pickup unit 400E of the eighth exemplary embodiment same as those of the image pickup unit 400 of the first exemplary embodiment will be denoted by the same reference signs and description thereof will be omitted.

As illustrated in FIG. 15, the image pickup unit 400E includes the image pickup element 300, a wiring board 500E, the frame 602, and the cover glass 603. The wiring board 500E is a printed wiring board in the eighth exemplary embodiment. The wiring board 500E includes a conductor portion and an insulator portion. The conductor portion is formed from a conductive metal material, for example, copper or gold. The insulator portion is formed from an electrically insulating material, for example, an epoxy resin.

The wiring board 500E is a layered board including a plurality of, for example, eight conductor layers 1E to 8E arranged with intervals therebetween in the Z direction, which is the thickness direction of the wiring board 500E. An insulator layer is disposed between each two adjacent conductor layers among the conductor layers 1E to 8E. A conductor pattern is disposed in each of the conductor layers 1E to 8E. The wiring board 500E includes two main surfaces 501E and 502E. The image pickup element 300 is mounted on the main surface 501E on the conductor layer 1E side of the wiring board 500E.

The plurality of conductor layers 1E to 8E are disposed in a layered manner in the order of the conductor layer 1E, the conductor layer 2E, the conductor layer 3E, the conductor layer 4E, the conductor layer 5E, the conductor layer 6E, the conductor layer 7E, and the conductor layer 8E from the image pickup element 300 side. The conductor layers 1E and 8E are surface layers, that is, outer layers, and the conductor layers 2E to 7E are inner layers. The circuit component 601 such as a capacitor is mounted on the main surface 502E on the conductor layer 8E side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1E and 8E.

The image pickup element 300 is disposed on the main surface 501E and connected to the wiring board 500E via wire bonding. To be noted, although the image pickup element 300 is mounted on the wiring board 500E via wire bonding, the configuration is not limited to this, and the image pickup element 300 may be mounted on the wiring board 500E via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 15, the wiring board 500E includes a ground wiring portion 570E that serves as the ground. The ground wiring portion 570E includes a ground wiring 571E serving as a first ground wiring and a ground wiring 572E serving as a second ground wiring.

The ground wiring 571E is connected to the plurality of ground electrodes 531. The plurality of ground electrodes 531 are disposed in the conductor layer 1E. FIG. 15 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 15 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 15 illustrates, among the plurality of wires 611, the wire $611_1$ that electrically interconnects the analog ground electrode $331_1$ and the ground electrode $531_1$, and the wire $611_2$ that electrically interconnects the analog ground electrode $331_2$ and the ground electrode $531_2$.

In the image pickup unit 400E, a closed loop L6 of analog ground is formed such that the closed loop L6 overlaps with the image pickup element 300 and the wiring board 500E when the image pickup unit 400E is viewed from the side, that is, when the image pickup unit 400E is viewed in the Y direction. In FIG. 15, the closed loop L6 is indicated by a two-dot chain line.

The closed loop L6 mainly includes the analog ground wiring 330 of the image pickup element 300 and the ground wiring 571E of the wiring board 500E. Specifically, the closed loop L6 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571E.

The ground wiring 572E is a part other than the ground wiring 571E, that is, a part that does not contribute to the formation of the closed loop L6 of the analog ground as viewed in the Y direction. For example, as viewed in the Y direction, the ground wiring 572E includes a portion that forms the closed loop of the digital ground together with the digital ground wiring 350 of the image pickup element 300 illustrated in FIG. 3 and a portion that does not contribute to formation of any closed loop.

The area of the closed loop L6 of the analog ground as viewed in the Y direction, that is, the area of a portion enclosed by the two-dot chain line in FIG. 15 is denoted by S6. The ground wiring 571E is disposed at a position further on the image pickup element 300 side than a center C6 of the wiring board 500E in the Z direction. The center C6 is a center between the two main surfaces 501E and 502E, and is indicated by a one-dot chain line in FIG. 15. Since the entirety of the ground wiring 571E is disposed at a position further on the image pickup element 300 side than the center C6 of the wiring board 500E in the Z direction, the area S6 of the closed loop L6 of the analog ground can be reduced. Since the induced electromotive force generated in the closed loop L6 is proportional to the area S6 of the closed loop L6, the electromotive force generated in the closed loop L6 can be reduced by reducing the area S6. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

The ground wiring 571E is constituted only by one conductor pattern 505E serving as a first conductor pattern. The conductor pattern 505E is disposed in the conductor layer 1E, which is a surface layer of the wiring board 500E on the side on which the image pickup element 300 is mounted. The ground electrodes 531 are formed integrally with the conductor pattern 505E. Since the conductor pattern 505E is disposed in the conductor layer 1E, the area S6 of the closed loop L6 can be reduced as much as possible, disturbance of the image generated by the image pickup element 300 can be effectively suppressed, and thus the quality of the generated image can be further improved.

The ground of the analog circuit and the ground of the digital circuit of the image pickup element 300 are preferably integrated, and the ground wiring 571E and the ground wiring 572E are electrically interconnected in the wiring board 500E. The ground wiring 571E is disposed at a position further on the image pickup element 300 side than the ground wiring 572E. The ground wiring 571E and the ground wiring 572E are electrically interconnected via only one via conductor 511E serving as a first via conductor disposed at one position such that the closed loop of the analog ground does not extend to the ground wiring 572E. That is, the analog ground and the digital ground are interconnected via only the via conductor 511E. In FIG. 15, the via conductor 511E is indicated by hatching different from that of the ground wiring 571E and 572E.

The ground wiring 571E is electrically connected to the analog ground wiring 330 of the image pickup element 300, and the ground wiring 572E is electrically connected to the digital ground wiring 350 of the image pickup element 300 illustrated in FIG. 3. In addition, the ground wiring 571E and the ground wiring 572E are electrically interconnected via only the one via conductor 511E. Since the ground wiring 571E and the ground wiring 572E are electrically interconnected via only the one via conductor 511E, the closed loop L6 of the analog ground does not extend to the ground wiring 572E, and thus the area S6 can be reduced. As a result of this, disturbance of the image generated by the image pickup element 300 can be suppressed, and thus the quality of the generated image can be improved.

The via conductor 511E is disposed to be deviated from at least the center and end portion of the conductor pattern 505E of the conductor layer 1E as viewed in the Z direction. As a result of this, disturbance of the image generated by the image pickup element 300 can be suppressed, and thus the quality of the generated image can be improved.

The ground wiring 572E includes a plurality of conductor patterns 506E serving as a plurality of second conductor patterns arranged with intervals therebetween, and a plurality of via conductors 508E serving as a plurality of third via conductors. The conductor patterns 506E are disposed in conductor layers 2E to 8E. The plurality of conductor patterns 506E are electrically interconnected via the plurality of via conductors 508E.

A plurality of conductor patterns 506E, two in FIG. 16, are disposed in each of the conductor layers 2E and 3E, and one conductor pattern 506E which is a solid pattern is disposed in each of the conductor layers 4E to 8E. That is, as illustrated in FIG. 16, the two conductor patterns 506E are not connected to each other in each of the conductor layers 2E and 3E. Therefore, the two conductor patterns 506E in each of the conductor layers 2E and 3E are electrically interconnected via the plurality of via conductors 508E and the conductor patterns 506E disposed in the other conductor layers 4E to 8E. As described above, the plurality of conductor patterns 506E included in the ground wiring 572E may be electrically interconnected via the plurality of via conductors 508E, and the number of conductor patterns 506E disposed in each conductor layer is not limited to 1 and may be 2 or more.

Ninth Exemplary Embodiment

Figure 17:
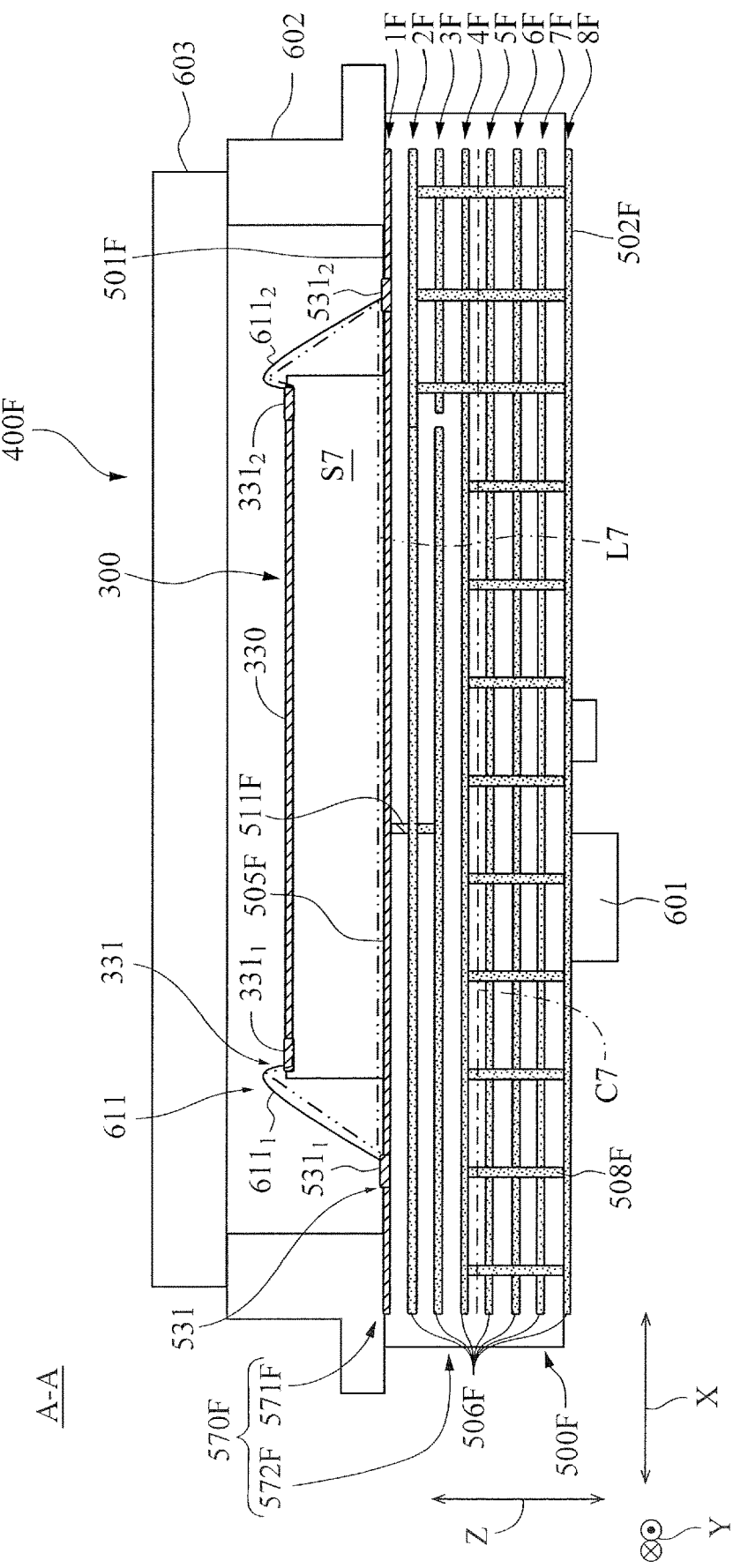
FIG. 17 is a section view of an image pickup unit according to a ninth exemplary embodiment.
Figure 18:
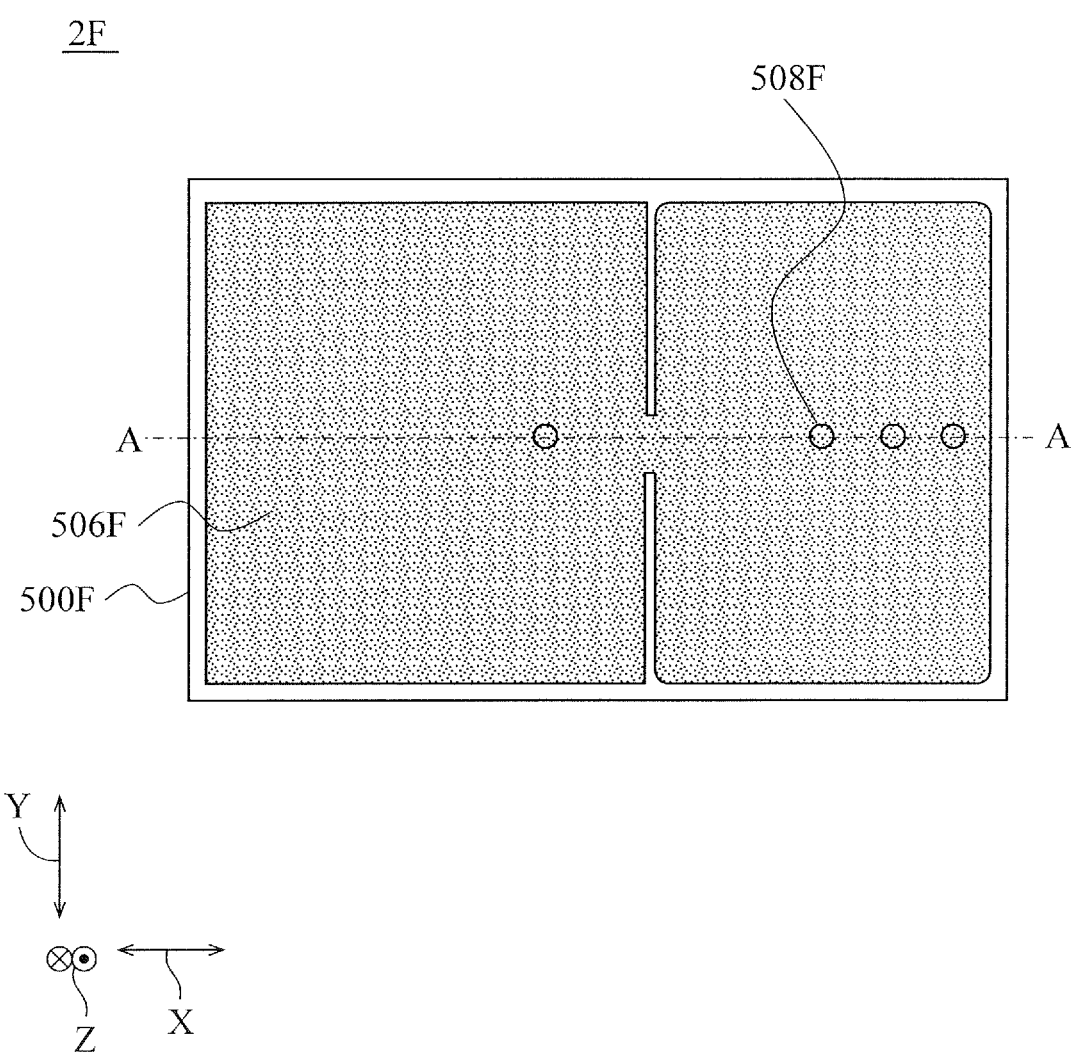
FIG. 18 is a plan view of a conductor layer of a wiring board according to the ninth exemplary embodiment.

An image pickup unit according to a ninth exemplary embodiment will be described. FIG. 17 is a section view of an image pickup unit 400F according to the ninth exemplary embodiment. FIG. 18 is a plan view of a second conductor layer of a wiring board according to the ninth exemplary embodiment. FIG. 17 schematically illustrates a section of the image pickup unit 400F in a side view taken along a line A-A of FIG. 18. To be noted, the constituents of the image pickup unit 400F of the ninth exemplary embodiment same as those of the image pickup unit 400 of the first exemplary embodiment will be denoted by the same reference signs and description thereof will be omitted.

As illustrated in FIG. 17, the image pickup unit 400F includes the image pickup element 300, a wiring board 500F, the frame 602, and the cover glass 603. The wiring board 500F is a printed wiring board in the ninth exemplary embodiment. The wiring board 500F includes a conductor portion and an insulator portion. The conductor portion is formed from a conductive metal material, for example, copper or gold. The insulator portion is formed from an electrically insulating material, for example, an epoxy resin.

The wiring board 500F is a layered board including a plurality of, for example, eight conductor layers 1F to 8F arranged with intervals therebetween in the Z direction, which is the thickness direction of the wiring board 500F. An insulator layer is disposed between each two adjacent conductor layers among the conductor layers 1F to 8F. A conductor pattern is disposed in each of the conductor layers 1F to 8F. The wiring board 500F includes two main surfaces 501F and 502F. The image pickup element 300 is mounted on the main surface 501F on the conductor layer 1F side of the wiring board 500F.

The plurality of conductor layers 1F to 8F are disposed in a layered manner in the order of the conductor layer 1F, the conductor layer 2F, the conductor layer 3F, the conductor layer 4F, the conductor layer 5F, the conductor layer 6F, the conductor layer 7F, and the conductor layer 8F from the image pickup element 300 side. The conductor layers 1F and 8F are surface layers, that is, outer layers, and the conductor layers 2F to 7F are inner layers. The circuit component 601 such as a capacitor is mounted on the main surface 502F on the conductor layer 8F side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1F and 8F.

The image pickup element 300 is disposed on the main surface 501F and connected to the wiring board 500F via wire bonding. To be noted, although the image pickup element 300 is mounted on the wiring board 500F via wire bonding, the configuration is not limited to this, and the image pickup element 300 may be mounted on the wiring board 500F via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 electrically connected to the pixel array 310. In addition, the image pickup element 300 includes the digital circuit 380. The digital circuit 380 includes the digital ground wiring 350. As illustrated in FIG. 17, the wiring board 500F includes a ground wiring portion 570F that serves as the ground. The ground wiring portion 570F includes a ground wiring 571F serving as a first ground wiring and a ground wiring 572F serving as a second ground wiring.

The ground wiring 571F is connected to the plurality of ground electrodes 531. The plurality of ground electrodes 531 are disposed in the conductor layer 1F. FIG. 17 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 17 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 17 illustrates, among the plurality of wires 611, the wire $611_1$ that electrically interconnects the analog ground electrode $331_1$ and the ground electrode $531_1$, and the wire $611_2$ that interconnects the analog ground electrode $331_2$ and the ground electrode $531_2$.

In the image pickup unit 400F, a closed loop L7 of analog ground is formed such that the closed loop L7 overlaps with the image pickup element 300 and the wiring board 500F when the image pickup unit 400F is viewed from the side, that is, when the image pickup unit 400F is viewed in the Y direction. In FIG. 17, the closed loop L7 is indicated by a two-dot chain line.

The closed loop L7 mainly includes the analog ground wiring 330 of the image pickup element 300 and the ground wiring 571F of the wiring board 500F. Specifically, the closed loop L7 includes the analog ground wiring 330, the pair of analog ground electrodes $331_1$ and $331_2$, the pair of wires $611_1$ and $611_2$, the pair of ground electrodes $531_1$ and $531_2$, and the ground wiring 571F.

The ground wiring 572F is a part other than the ground wiring 571F, that is, a part that does not contribute to the formation of the closed loop L7 of the analog ground as viewed in the Y direction. For example, as viewed in the Y direction, the ground wiring 572F includes a portion that forms the closed loop of the digital ground together with the digital ground wiring 350 of the image pickup element 300 illustrated in FIG. 3 and a portion that does not contribute to formation of any closed loop.

Here, the area of the closed loop L7 of the analog ground as viewed in the Y direction, that is, the area of a portion enclosed by the two-dot chain line in FIG. 17 is denoted by S7. The ground wiring 571F is disposed at a position further on the image pickup element 300 side than a center C7 of the wiring board 500F in the Z direction. The center C7 is a center between the two main surfaces 501F and 502F, and is indicated by a one-dot chain line in FIG. 17. Since the entirety of the ground wiring 571F is disposed at a position further on the image pickup element 300 side than the center C7 of the wiring board 500F in the Z direction, the area S7 of the closed loop L7 of the analog ground can be reduced. Since the induced electromotive force generated in the closed loop L7 is proportional to the area S7 of the closed loop L7, the electromotive force generated in the closed loop L7 can be reduced by reducing the area S7. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

The ground wiring 571F is constituted only by one conductor pattern 505F serving as a first conductor pattern. The conductor pattern 505F is disposed in the conductor layer 1F, which is a surface layer of the wiring board 500F on the side on which the image pickup element 300 is mounted. The ground electrodes 531 are formed integrally with the conductor pattern 505F. Since the conductor pattern 505F is disposed in the conductor layer 1F, the area S7 of the closed loop L7 can be reduced as much as possible, disturbance of the image generated by the image pickup element 300 can be effectively suppressed, and thus the quality of the generated image can be further improved.

The ground of the analog circuit and the ground of the digital circuit of the image pickup element 300 are preferably integrated, and the ground wiring 571F and the ground wiring 572F are electrically interconnected in the wiring board 500F. The ground wiring 571F is disposed at a position further on the image pickup element 300 side than the ground wiring 572F. The ground wiring 571F and the ground wiring 572F are electrically interconnected via only one via conductor 511F serving as a first via conductor disposed at one position such that the closed loop of the analog ground does not extend to the ground wiring 572F. That is, the analog ground and the digital ground are interconnected via only the via conductor 511F. In FIG. 17, the via conductor 511F is indicated by hatching different from that of the ground wiring 571F and 572F.

The ground wiring 571F is electrically connected to the analog ground wiring 330 of the image pickup element 300, and the ground wiring 572F is electrically connected to the digital ground wiring 350 of the image pickup element 300 illustrated in FIG. 3. In addition, the ground wiring 571F and the ground wiring 572F are electrically interconnected via only the one via conductor 511F. Since the ground wiring 571F and the ground wiring 572F are electrically interconnected via only the one via conductor 511F, the closed loop of the analog ground does not extend to the ground wiring 572F, and thus the area S7 can be reduced. As a result of this, disturbance of the image generated by the image pickup element 300 can be suppressed, and thus the quality of the generated image can be improved.

The via conductor 511F is disposed to be deviated from at least the center and end portion of the conductor pattern 505F of the conductor layer 1F as viewed in the Z direction. As a result of this, disturbance of the image generated by the image pickup element 300 can be effectively suppressed, and thus the quality of the generated image can be further improved.

The ground wiring 572F includes a plurality of conductor patterns 506F serving as a plurality of second conductor patterns arranged with intervals therebetween, and a plurality of via conductors 508F serving as a plurality of third via conductors. The conductor patterns 506F are disposed in the conductor layers 2F to 8F. The plurality of conductor patterns 506F are electrically interconnected via the plurality of via conductors 508F.

One conductor pattern 506F is disposed in the conductor layer 2F, a plurality of the conductor patterns 506F are disposed in the conductor layer 3F, and one conductor pattern 506F which is a solid pattern is disposed in each of the conductor layer 4F to 8F. As illustrated in FIG. 18, the conductor pattern 506F disposed in the conductor layer 2F does not have to be a solid pattern. That is, the shape of each conductor pattern 506F is not limited to a solid pattern, and may be arbitrarily selected.

Tenth Exemplary Embodiment

Figure 19:
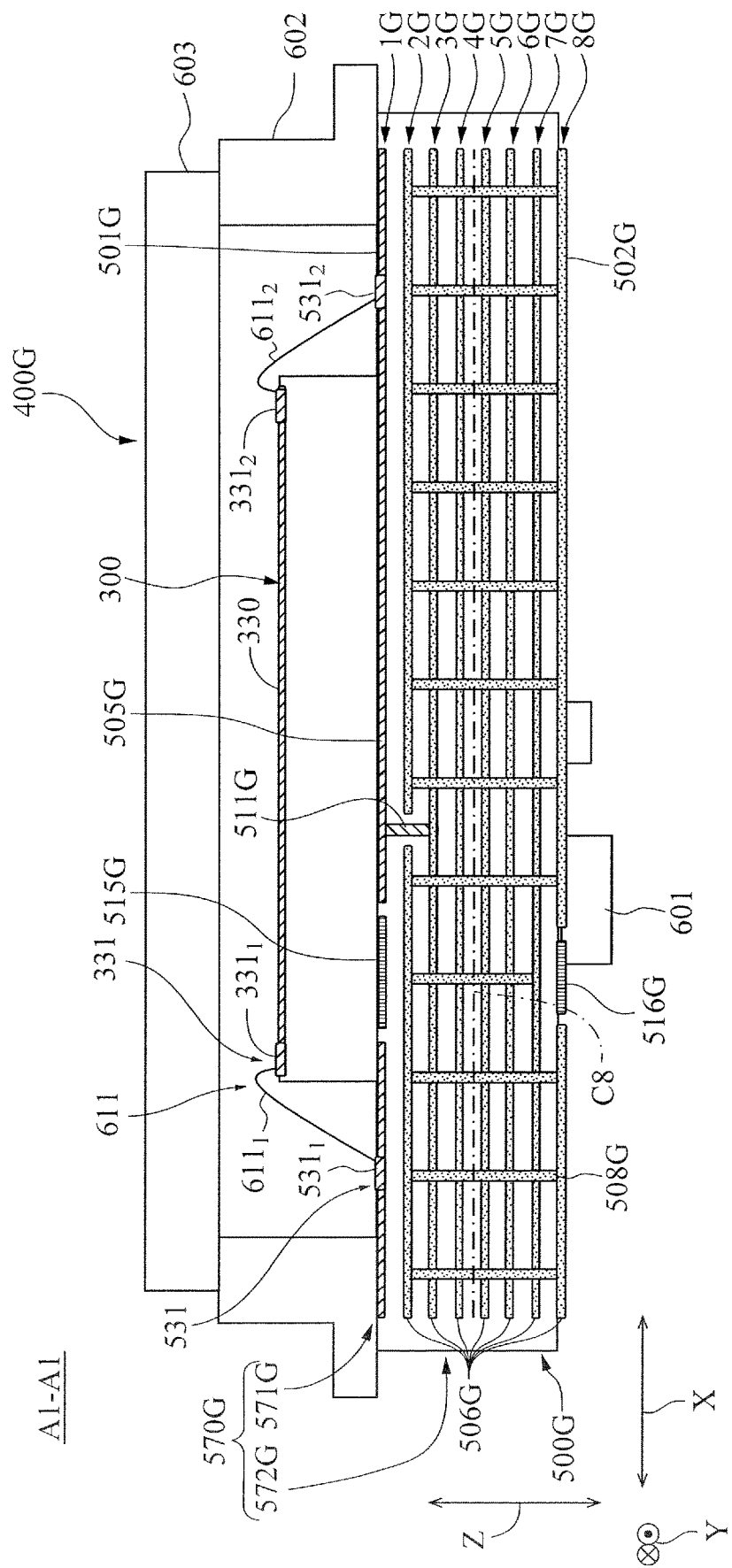
FIG. 19 is a section view of an image pickup unit according to a tenth exemplary embodiment.
Figure 20:
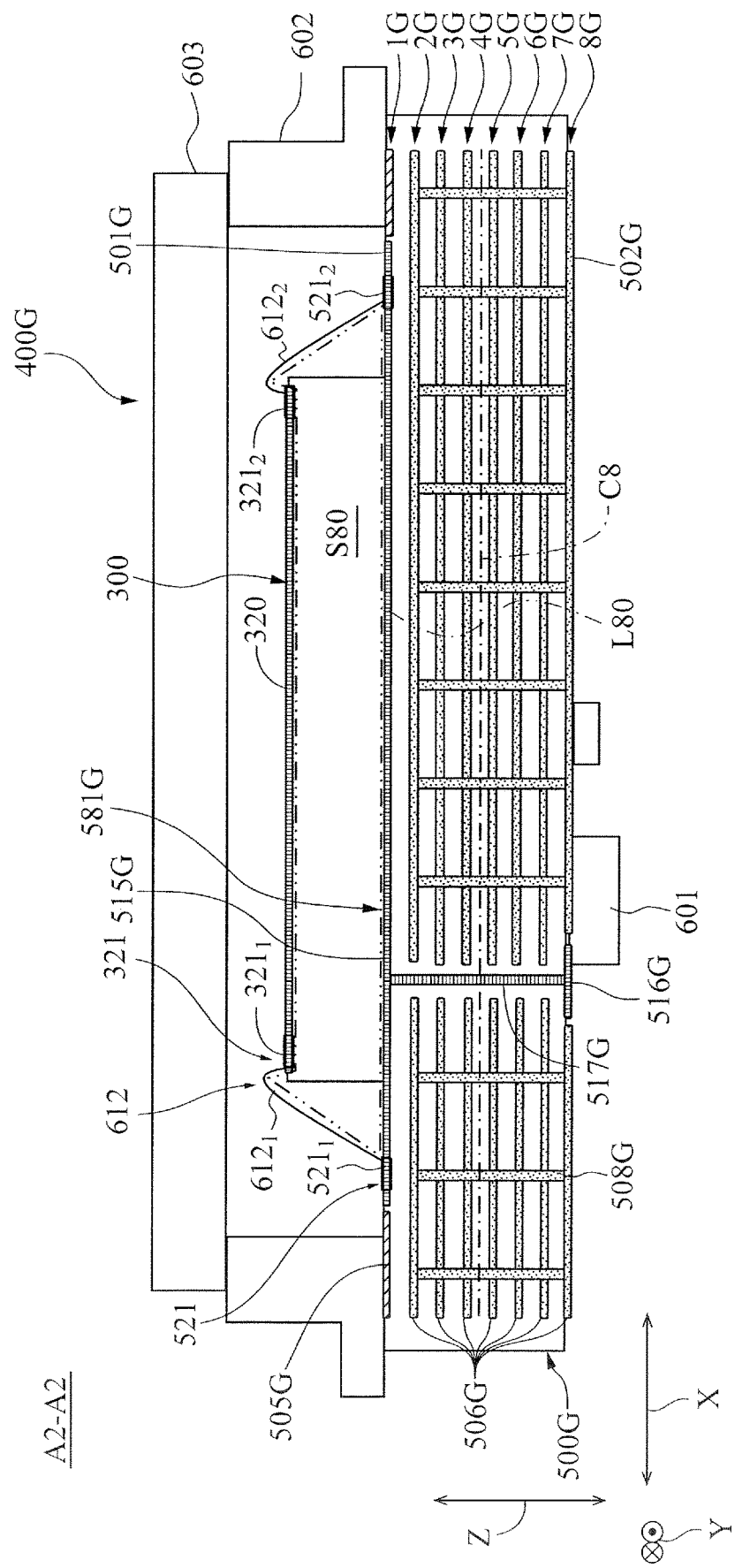
FIG. 20 is a section view of the image pickup unit according to the tenth exemplary embodiment.
Figure 21:
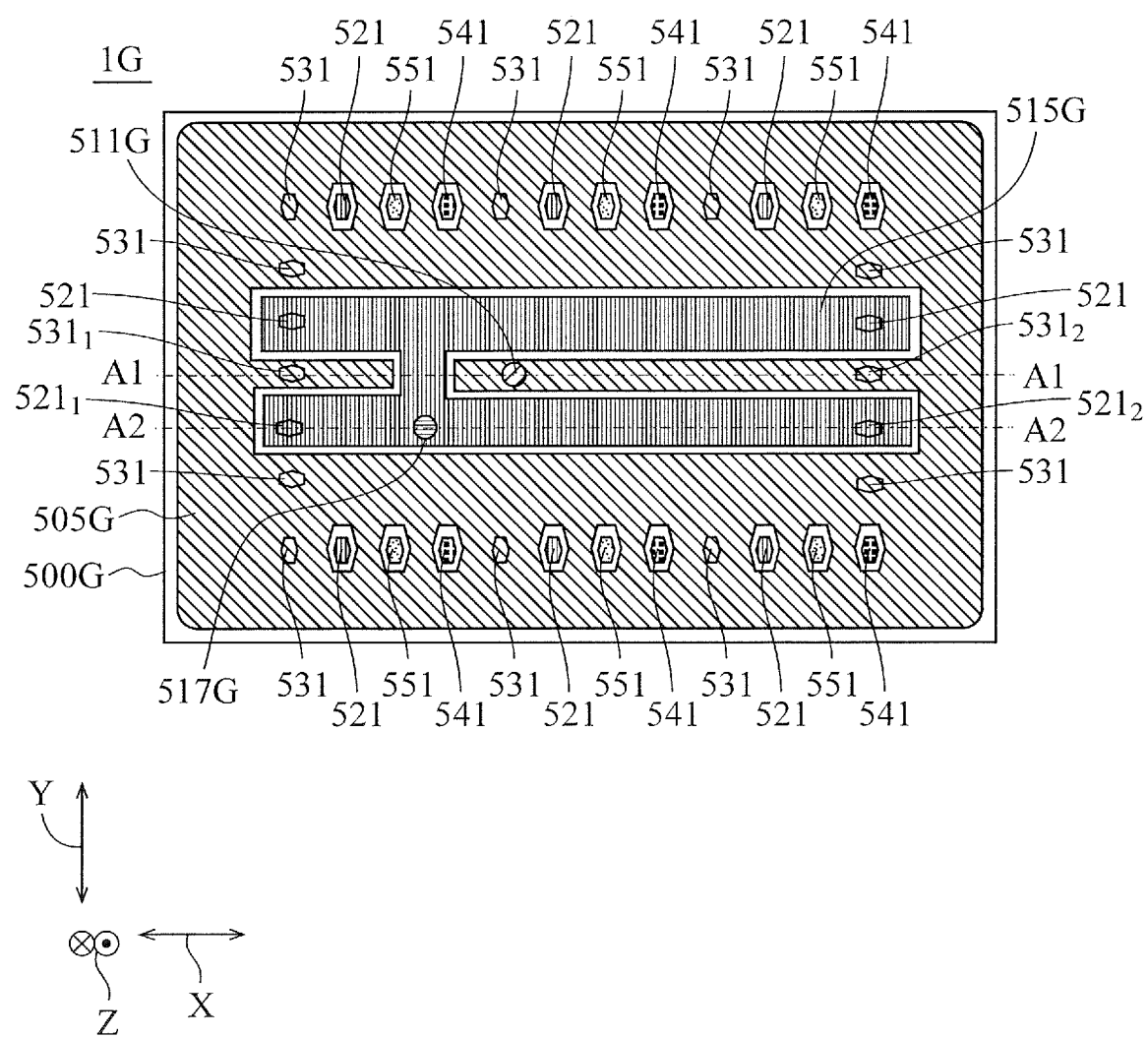
FIG. 21 is a plan view of a conductor layer of a wiring board according to the tenth exemplary embodiment.

An image pickup unit according to a tenth exemplary embodiment will be described. FIGS. 19 and 20 are each a section view of an image pickup unit 400G according to the tenth exemplary embodiment. FIG. 21 is a plan view of a first conductor layer of a wiring board according to the tenth exemplary embodiment. FIG. 19 schematically illustrates a section of the image pickup unit 400G in a side view taken along a line A1-A1 of FIG. 21. FIG. 20 schematically illustrates a section of the image pickup unit 400G in the side view taken along a line A2-A2 of FIG. 21. To be noted, the constituents of the tenth exemplary embodiment same as those of the first exemplary embodiment will be denoted by the same reference signs and description thereof will be omitted.

As illustrated in FIGS. 19 and 20, the image pickup unit 400G includes the image pickup element 300, a wiring board 500G, the frame 602, and the cover glass 603. The wiring board 500G is a printed wiring board in the tenth exemplary embodiment. The wiring board 500G includes a conductor portion and an insulator portion. The conductor portion is formed from a conductive metal material, for example, copper or gold. The insulator portion is formed from an electrically insulating material, for example, an epoxy resin.

The wiring board 500G is a layered board including a plurality of, for example, eight conductor layers 1G to 8G arranged with intervals therebetween in the Z direction, which is the thickness direction of the wiring board 500G. An insulator layer is disposed between each two adjacent conductor layers among the conductor layers 1G to 8G. A conductor pattern is disposed in each of the conductor layers 1G to 8G. The wiring board 500G includes two main surfaces 501G and 502G. The image pickup element 300 is mounted on the main surface 501G on the conductor layer 1G side of the wiring board 500G.

The plurality of conductor layers 1G to 8G are disposed in a layered manner in the order of the conductor layer 1G, the conductor layer 2G, the conductor layer 3G, the conductor layer 4G, the conductor layer 5G, the conductor layer 6G, the conductor layer 7G, and the conductor layer 8G from the image pickup element 300 side. The conductor layers 1G and 8G are surface layers, that is, outer layers, and the conductor layers 2G to 7G are inner layers. The circuit component 601 such as a capacitor is mounted on the main surface 502G on the conductor layer 8G side. To be noted, the number of the conductor layers is not limited to 8, and may be any number that is equal to or larger than 2. However, considering the arrangement of wiring, the number of conductor layers is preferably 3 or more, and more preferably 4 or more. In addition, unillustrated solder resist may be provided on the conductor layers 1G and 8G.

The image pickup element 300 is disposed on the main surface 501G and connected to the wiring board 500G via wire bonding. To be noted, although the image pickup element 300 is mounted on the wiring board 500G via wire bonding, the configuration is not limited to this, and the image pickup element 300 may be mounted on the wiring board 500G via flip chip bonding. In this case, the image pickup element and the wiring board are connected to each other via a plurality of metal members such as a plurality of solder balls.

As illustrated in FIG. 3, the image pickup element 300 includes the analog circuit 370. The analog circuit 370 includes the pixel array 310 and the analog ground wiring 330 illustrated in FIG. 19 electrically connected to the pixel array 310. In addition, the image pickup element 300 includes the digital circuit 380. The digital circuit 380 includes the digital ground wiring 350. Further, the analog circuit 370 includes the analog power source wiring 320 illustrated in FIG. 20 that is electrically connected to the pixel array 310. The digital circuit 380 includes the digital power source wiring 340. As illustrated in FIG. 19, the wiring board 500G includes a ground wiring portion 570G that serves as the ground. The ground wiring portion 570G includes a ground wiring 571G serving as a first ground wiring and a ground wiring 572G serving as a second ground wiring.

The ground wiring 571G is connected to the plurality of ground electrodes 531. The plurality of ground electrodes 531 are disposed in the conductor layer 1G. FIG. 19 illustrates the pair of ground electrodes $531_1$ and $531_2$ arranged apart from each other in the X direction among the plurality of ground electrodes 531. The analog ground wiring 330 is connected to the plurality of analog ground electrodes 331. FIG. 19 illustrates the pair of analog ground electrodes $331_1$ and $331_2$ arranged apart from each other in the X direction among the plurality of analog ground electrodes 331. The plurality of analog ground electrodes 331 and the plurality of ground electrodes 531 are electrically interconnected via the plurality of wires 611. The plurality of wires 611 are included in the plurality of wires 610 illustrated in FIG. 4. FIG. 19 illustrates, among the plurality of wires 611, the wire $611_1$ that electrically interconnects the analog ground electrode $331_1$ and the ground electrode $531_1$, and the wire $611_2$ that interconnects the analog ground electrode $331_2$ and the ground electrode $531_2$.

In the image pickup unit 400G, a closed loop of analog ground is formed such that the closed loop overlaps with the image pickup element 300 and the wiring board 500G when the image pickup unit 400G is viewed from the side, that is, when the image pickup unit 400G is viewed in the Y direction.

The ground wiring 572G is a part other than the ground wiring 571G, that is, a part that does not contribute to the formation of the closed loop of the analog ground as viewed in the Y direction. For example, as viewed in the Y direction, the ground wiring 572G includes a portion that forms the closed loop of the digital ground together with the digital ground wiring 350 of the image pickup element 300 illustrated in FIG. 3 and a portion that does not contribute to formation of any closed loop.

As illustrated in FIG. 19, the ground wiring 571G is disposed at a position further on the image pickup element 300 side than a center C8 of the wiring board 500G in the Z direction. The center C8 is a center between the two main surfaces 501G and 502G, and is indicated by a one-dot chain line in FIG. 19. Since the entirety of the ground wiring 571G is disposed at a position further on the image pickup element 300 side than the center C8 of the wiring board 500G in the Z direction, the area of the closed loop of the analog ground can be reduced. Since the induced electromotive force generated in the closed loop is proportional to the area of the closed loop, the electromotive force generated in the closed loop can be reduced by reducing the area of the closed loop. Therefore, the voltage fluctuation of the analog ground can be reduced, and thus occurrence of a pattern noise in the output image of the image pickup element 300 can be prevented. That is, disturbance of the image generated by the image pickup element 300 can be suppressed, and thus the quality of the generated image can be improved.

The ground wiring 571G is constituted only by one conductor pattern 505G serving as a first conductor pattern. The conductor pattern 505G is disposed in the conductor layer 1G, which is a surface layer of the wiring board 500G on the side on which the image pickup element 300 is mounted. As a result of this, the area of the closed loop can be reduced as much as possible, disturbance of the image generated by the image pickup element 300 can be effectively suppressed, and thus the quality of the generated image can be further improved.

The ground wiring 572G includes a plurality of conductor patterns 506G serving as a plurality of second conductor patterns arranged with intervals therebetween, and a plurality of via conductors 508G serving as a plurality of third via conductors. The conductor patterns 506G are disposed in the conductor layers 2G to 8G. The plurality of conductor patterns 506G are electrically interconnected via the plurality of via conductors 508G.

The ground of the analog circuit and the ground of the digital circuit of the image pickup element 300 are preferably integrated, and the ground wiring 571G and the ground wiring 572G are electrically interconnected in the wiring board 500G. The ground wiring 571G is disposed at a position further on the image pickup element 300 side than the ground wiring 572G. In the tenth exemplary embodiment, the ground wiring 571G and the ground wiring 572G are electrically interconnected via only one via conductor 511G serving as a first via conductor disposed at one position. That is, the analog ground and the digital ground are interconnected via only the via conductor 511G. In FIG. 19, the via conductor 511G is indicated by hatching different from that of the ground wiring 571G and 572G.

As also described in the first exemplary embodiment, closed loops in the image pickup unit 400G have different resistances with respect to the magnetic field noise depending on the types of circuits to which the closed loops are connected. Specifically, in the image pickup unit 400G, the closed loop of the power source of the analog circuit, which will be referred to as an "analog power source" below, has lower resistance to the magnetic field noise than the closed loop of the power source of the digital circuit, which will be referred to as a "digital power source" below. That is, the closed loop of the analog power source is most likely to be affected by the magnetic field noise after the closed loop of the analog ground. Particularly, the wiring related to the pixel array 310 of FIG. 3 has low resistance to the magnetic field noise because the magnetic field noise directly affects the pixel signal therein. In addition, wiring having lower impedance has lower resistance to the magnetic field noise because the induced current more easily flows in wiring having lower impedance. In the case where a distribution of voltage is generated in the closed loop of the analog power source, the pixel signal changes in accordance with the power source potential distribution.

As illustrated in FIG. 20, the wiring board 500G includes a power source wiring 581G. The power source wiring 581G is connected to the plurality of power source electrodes 521. FIG. 20 illustrates a pair of power source electrodes $521_1$ and $521_2$ arranged apart from each other in the X direction among the plurality of power source electrodes 521. The analog power source wiring 320 is connected to the plurality of analog power source electrodes 321. FIG. 20 illustrates a pair of analog power source electrodes $321_1$ and $321_2$ arranged apart from each other in the X direction among the plurality of analog power source electrodes 321. The plurality of analog power source electrodes 321 and the plurality of power source electrodes 521 are electrically interconnected via a plurality of wires 612. The plurality of wires 612 are included in the plurality of wires 610 illustrated in FIG. 4. FIG. 20 illustrates, among the plurality of wires 612, a wire $612_1$ that electrically interconnects the analog power source electrode $321_1$ and the power source electrode $521_1$, and a wire $612_2$ that electrically interconnects the analog power source electrode $321_2$ and the power source electrode $521_2$.

In the image pickup unit 400G, a closed loop L80 of analog power source is formed such that the closed loop L80 overlaps with the image pickup element 300 and the wiring board 500G when the image pickup unit 400G is viewed from the side, that is, when the image pickup unit 400G is viewed in the Y direction. In FIG. 20, the closed loop L80 is indicated by a two-dot chain line.

Here, the area of the closed loop L80 of the analog power source as viewed in the Y direction, that is, the area of a portion enclosed by the two-dot chain line in FIG. 20 is denoted by S80. The power source wiring 581G is disposed at a position further on the image pickup element 300 side than a center C8 of the wiring board 500G in the Z direction. Since the entirety of the power source wiring 581G is disposed at a position further on the image pickup element 300 side than the center C8 of the wiring board 500G in the Z direction, the area S80 of the closed loop L80 of the analog power source can be reduced. Since the induced electromotive force generated in the closed loop L80 is proportional to the area S80 of the closed loop L80, the electromotive force generated in the closed loop L80 can be reduced by reducing the area S80. Therefore, the voltage fluctuation of the analog power source can be reduced, and thus occurrence of a pattern noise in the output image of the image pickup element 300 can be prevented. That is, disturbance of the image generated by the image pickup element 300 can be suppressed, and thus the quality of the generated image can be improved.

In the tenth exemplary embodiment, the power source wiring 581G is constituted only by one conductor pattern 515G serving as a first conductor pattern. The conductor pattern 515G is disposed in the conductor layer 1G, which is a surface layer of the wiring board 500G on the side on which the image pickup element 300 is mounted as illustrated in FIGS. 20 and 21. Since the conductor pattern 515G is disposed in the conductor layer 1G, the area S80 of the closed loop L80 can be reduced as much as possible, disturbance of the image generated by the image pickup element 300 can be effectively suppressed, and thus the quality of the generated image can be further improved.

As illustrated in FIGS. 20 and 21, the power source electrodes 521 are integrally formed with the conductor pattern 515G. A conductor pattern 516G connected to a power source terminal of the circuit component 601 is disposed in the conductor layer 8G. The conductor pattern 516G is electrically connected to the conductor pattern 515G via one via conductor 517G. Power is supplied to the analog circuit of the image pickup element 300 and the circuit component 601 via the wiring described above. To be noted, by reducing the distance between the via conductor 511G and the via conductor 517G, the area of a closed loop formed by the analog power source and the analog ground can be also reduced.

The present invention is not limited to the exemplary embodiments described above, and various modifications can be made within the technical concept of the present invention. In addition, effects described in the exemplary embodiments are merely enumeration of the most preferable effects that can be achieved by the present invention, and the effects of the present invention are not limited to the effects described in the exemplary embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-170611, filed Sep. 12, 2018, and Japanese Patent Application No. 2019-142807, filed Aug. 2, 2019, which are hereby incorporated by reference herein in their entirety.

What is claimed is:

1. An electric apparatus comprising:
   an electric component comprising an analog circuit, the analog circuit comprising an analog ground wiring;
   a wiring board on which the electric component is mounted,
   wherein the wiring board comprises
   (1) a first ground wiring that is connected to the analog ground wiring and forms a closed loop with the analog ground wiring in a side view of the electric apparatus, the first ground wiring being disposed in a first layer, and (2) a second ground wiring, at least one portion of the second ground wiring being disposed in a second layer located farther from the electronic component than the first layer, wherein the at least one portion of the second ground wiring disposed in the second layer is electrically connected to the first ground wiring via only a first via conductor.

2. The electric apparatus according to claim 1, wherein the first ground wiring is disposed at a position further on the electric component side than a center of the wiring board in a thickness direction of the wiring board.

3. The electric apparatus according to claim 2, wherein the first ground wiring is constituted only by one first conductive pattern disposed in a surface layer of the wiring board.

4. The electric apparatus according to claim 2, wherein the first ground wiring comprises (a) a plurality of first conductor patterns arranged with intervals therebetween and (b) a plurality of second via conductors that interconnect the plurality of first conductor patterns, and wherein at least one of the plurality of first conductor patterns is disposed in a surface layer of the wiring board.

5. The electric apparatus according to claim 1, wherein the first ground wiring is disposed at a position further on the electric component side than the second ground wiring in a thickness direction of the wiring board.

6. The electric apparatus according to claim 1, wherein the electric component comprises a digital circuit comprising a digital ground wiring, and wherein the second ground wiring is connected to the digital ground wiring.

7. The electric apparatus according to claim 1, wherein the analog circuit comprises an analog power source wiring, and wherein the wiring board comprises a power source wiring that is connected to the analog power source wiring and forms a closed loop with the analog power source wiring in the side view.

8. The electric apparatus according to claim 1, wherein the analog circuit comprises a pixel array comprising a plurality of pixels.

9. The electric apparatus according to claim 1, wherein the electric component comprises an image pickup chip.

10. An electric apparatus comprising:
an electric component comprising an analog ground circuit, the analog ground circuit comprising an analog ground wiring; and
a wiring board on which the electric component is mounted,
wherein the wiring board comprises
(1) a first ground wiring that is connected to the analog ground wiring and forms a closed loop with the analog ground wiring in a side view of the electric apparatus, and
(2) a second ground wiring that is connected to the first ground wiring via only a plurality of first via conductors, and
wherein the following formula is satisfied $$D1 \leq \frac{\sqrt{X1^2 + Y1^2}}{10}$$

wherein X1 represents a length of a first side of the electric component in a plan view, Y1 represents a length of a second side of the electric component intersecting with the first side in the plan view, and D1 represents a distance between two most separated first via conductors among the plurality of first via conductors in the plan view.

11. The electric apparatus according to claim 10, wherein the first ground wiring is disposed at a position further on the electric component side than a center of the wiring board in a thickness direction of the wiring board.

12. The electric apparatus according to claim 11, wherein the first ground wiring is constituted only by one first conductive pattern disposed in a surface layer of the wiring board.

13. The electric apparatus according to claim 11, wherein the first ground wiring comprises a plurality of first conductor patterns arranged with intervals therebetween and a plurality of second via conductors that interconnect the plurality of first conductor patterns, and wherein at least one of the plurality of first conductor patterns is disposed in a surface layer of the wiring board.

14. The electric apparatus according to claim 13, wherein the distance between the two most separated first via conductors among the plurality of first via conductors is smaller than a distance between two most separated second via conductors among the plurality of second via conductors.

15. The electric apparatus according to claim 10, wherein the first ground wiring is disposed at a position further on the electric component side than the second ground wiring in a thickness direction of the wiring board.

16. The electric apparatus according to claim 10, wherein the second ground wiring comprises a plurality of second via conductor patterns arranged with intervals therebetween and a plurality of third via conductors interconnecting the plurality of second via conductor patterns, and wherein the distance between the two most separated first via conductors among the plurality of first via conductors is smaller than a distance between two most separated third via conductors among the plurality of third via conductors.

17. The electric apparatus according to claim 10, wherein the wiring board comprises a third conductor pattern interconnecting the plurality of first via conductors.

18. The electric apparatus according to claim 10, wherein the electric component comprises a digital circuit comprising a digital ground wiring, and wherein the second ground wiring is connected to the digital ground wiring.

19. The electric apparatus according to claim 10, wherein the analog circuit comprises an analog power source wiring, and wherein the wiring board comprises a power source wiring that is connected to the analog power source wiring and forms a closed loop with the analog power source wiring.

20. The electric apparatus according to claim 10, wherein the analog circuit comprises a pixel array comprising a plurality of pixels.

21. The electric apparatus according to claim 10, wherein the electric component comprises an image pickup chip.

22. The electric apparatus according to claim 10, wherein the first ground wiring is disposed in a first layer, wherein the at least one portion of the second ground wiring is disposed in a second layer located farther from the electronic component than the first layer, and wherein the at least one portion of the second ground wiring disposed in the second layer is electrically connected to the first ground wiring via only a first via conductor.

23. An image pickup apparatus comprising:
a casing;
an inductor element disposed inside the casing; and
the electric apparatus according to claim 9 disposed inside the casing.

24. An image pickup apparatus comprising:
a casing;
an inductor element disposed inside the casing; and
the electric apparatus according to claim 21 disposed inside the casing.

25. An image pickup apparatus comprising:
a casing;
the electric apparatus according to claim 9 disposed inside the casing; and
a mount to and from which a lens barrel comprising an optical system and an inductor element is attachable and detachable.

26. An image pickup apparatus comprising:
a casing;
the electric apparatus according to claim 21 disposed inside the casing; and
a mount to and from which a lens barrel comprising an optical system and an inductor element is attachable and detachable.

* * * * *